(12) United States Patent
Higashida

(10) Patent No.: US 9,728,654 B2
(45) Date of Patent: Aug. 8, 2017

(54) SEMICONDUCTOR DEVICE AND METHOD OF MANUFACTURING SAME

(71) Applicant: ROHM CO., LTD., Kyoto (JP)

(72) Inventor: Syoji Higashida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/058,018

(22) Filed: Mar. 1, 2016

(65) Prior Publication Data

US 2016/0181442 A1    Jun. 23, 2016

Related U.S. Application Data

(62) Division of application No. 14/294,892, filed on Jun. 3, 2014, now abandoned.

(30) Foreign Application Priority Data

Jun. 5, 2013 (JP) ................... 2013-118454

(51) Int. Cl.
*H01L 29/872* (2006.01)
*H01L 29/66* (2006.01)
(Continued)

(52) U.S. Cl.
CPC ...... *H01L 29/872* (2013.01); *H01L 21/26513* (2013.01); *H01L 29/0619* (2013.01); *H01L 29/0634* (2013.01); *H01L 29/0684* (2013.01); *H01L 29/1608* (2013.01); *H01L 29/417* (2013.01); *H01L 29/66143* (2013.01); *H01L 29/861* (2013.01); *H01L 21/26586* (2013.01)

(58) Field of Classification Search
CPC .................... H01L 29/872; H01L 21/265; H01L 29/66143
See application file for complete search history.

(56) References Cited

U.S. PATENT DOCUMENTS 6,524,900 B2    2/2003    Dahlqvist et al.
6,683,347 B1    1/2004    Fujihira
(Continued)

FOREIGN PATENT DOCUMENTS

JP    2000-40822 A    2/2000
JP    2000-349304 A    12/2000
(Continued)

*Primary Examiner* — Michele Fan
(74) *Attorney, Agent, or Firm* — Chen Yoshimura LLP

(57) ABSTRACT

A semiconductor device includes: a first conductive type semiconductor device; a first conductive type drift region formed by epitaxial growth on the semiconductor substrate; a plurality of first conductive type vertical implantation regions formed by multistage ion implantation in the drift region, the vertical implantation regions having a prescribed vertical implantation width and a prescribed drift region width; an anode electrode disposed on the front surface of the drift region opposite to the semiconductor substrate, the anode electrode being in Schottky contact with the drift region and in ohmic contact with the first conductive type vertical implantation regions; and a cathode electrode disposed on the rear surface of the semiconductor substrate opposite to the drift region, the cathode electrode being in ohmic contact with the semiconductor substrate.

12 Claims, 33 Drawing Sheets

(51) Int. Cl.
    *H01L 29/861*     (2006.01)
    *H01L 29/16*     (2006.01)
    *H01L 21/265*     (2006.01)
    *H01L 29/06*     (2006.01)
    *H01L 29/417*     (2006.01)

(56) References Cited

U.S. PATENT DOCUMENTS

| | | |
|---|---|---|
| 9,059,147 B1 * | 6/2015 | Pan .................. H01L 29/0619 |
| 2003/0132450 A1 | 7/2003 | Minato et al. |
| 2003/0160262 A1 | 8/2003 | Kitada et al. |
| 2004/0046224 A1 * | 3/2004 | Rossel ................ H01L 29/872 257/471 |
| 2006/0237813 A1 | 10/2006 | Hshieh et al. |
| 2007/0075392 A1 * | 4/2007 | Pan ...................... H01L 29/407 257/483 |
| 2008/0029838 A1 | 2/2008 | Zhang et al. |
| 2008/0169475 A1 | 7/2008 | Nishio et al. |
| 2008/0246096 A1 | 10/2008 | Sakakibara et al. |
| 2009/0039456 A1 | 2/2009 | Bhalla et al. |
| 2009/0085044 A1 | 4/2009 | Ohno et al. |
| 2009/0289262 A1 | 11/2009 | Zhang et al. |
| 2011/0248285 A1 | 10/2011 | Zhang et al. |
| 2011/0248286 A1 | 10/2011 | Onose |
| 2012/0018836 A1 | 1/2012 | Nagai et al. |
| 2012/0056197 A1 | 3/2012 | Mizukami et al. |
| 2012/0256192 A1 | 10/2012 | Zhang et al. |
| 2013/0062723 A1 | 3/2013 | Henning et al. |
| 2014/0138705 A1 | 5/2014 | Zhang et al. |
| 2014/0145289 A1 | 5/2014 | Zhang |
| 2014/0266403 A1 | 9/2014 | Das et al. |

FOREIGN PATENT DOCUMENTS

| | | |
|---|---|---|
| JP | 2002-76370 A | 3/2002 |
| JP | 2008-258313 A | 10/2008 |
| JP | 2010-147399 A | 7/2010 |
| JP | 2013-102087 A | 5/2013 |

* cited by examiner

| Item | 2MeV | 1.1MeV | 500keV | 100keV | Concentration Rate |
|---|---|---|---|---|---|
| ref | 1.00 | 1.00 | 1.00 | 1.00 | |
| A-1 | 0.85 | 0.90 | 0.95 | 1.00 | -5% Fixed Quantity |
| A-2 | 0.70 | 0.80 | 0.90 | 1.00 | -10% Fixed Quantity |
| A-3 | 0.55 | 0.70 | 0.85 | 1.00 | -15% Fixed Quantity |
| A-4 | 0.40 | 0.60 | 0.80 | 1.00 | -20% Fixed Quantity |
| A-5 | 0.25 | 0.50 | 0.75 | 1.00 | -25% Fixed Quantity |
| A-6 | 0.10 | 0.40 | 0.70 | 1.00 | -30% Fixed Quantity |

FIG. 13

| Item | 2MeV | 1.1MeV | 500keV | 100keV | Concentration Rate |
|---|---|---|---|---|---|
| ref | 1.00 | 1.00 | 1.00 | 1.00 | |
| G-1 | 0.95^3 | 0.95^2 | 0.95 | 1.00 | -5% Fixed Rate |
| G-2 | 0.90^3 | 0.90^2 | 0.90 | 1.00 | -10% Fixed Rate |
| G-3 | 0.85^3 | 0.85^2 | 0.85 | 1.00 | -15% Fixed Rate |
| G-4 | 0.80^3 | 0.80^2 | 0.80 | 1.00 | -20% Fixed Rate |
| G-5 | 0.75^3 | 0.75^2 | 0.75 | 1.00 | -25% Fixed Rate |
| G-6 | 0.70^3 | 0.70^2 | 0.70 | 1.00 | -30% Fixed Rate |

FIG. 14

SEMICONDUCTOR DEVICE AND METHOD OF MANUFACTURING SAME

BACKGROUND OF THE INVENTION

Field of the Invention

The present invention relates to a semiconductor device and a method of manufacturing the same, and in particular, relates to a semiconductor device constituted of a Schottky barrier diode (SBD) having a super junction (SJ) structure, and a method of manufacturing the same.

Description of Related Art

Different types of semiconductor devices with the SJ structure have been proposed. Metal oxide semiconductors (MOS) and field effect transistors (FET) are already disclosed as examples of semiconductor devices having the SJ structure (refer to Patent Document 1, for example).

Trench SBDs having SJ structures have also already been disclosed (refer to Patent Document 2, for example).

SBDs having the SJ structure have also already been disclosed (refer to Patent Documents 1 to 3, for example).

RELATED ART DOCUMENTS

Patent Documents

Patent Document 1: Japanese Patent Application Laid-Open Publication No. 2000-40822
Patent Document 2: Japanese Patent Application Laid-Open Publication No. 2010-147399
Patent Document 3: Japanese Patent Application Laid-Open Publication No. 2008-258313
Patent Document 4: Japanese Patent Application Laid-Open Publication No. 2000-349304
Patent Document 5: Japanese Patent Application Laid-Open Publication No. 2002-76370

SUMMARY OF THE INVENTION

An object of the present invention is to provide a semiconductor device with improved withstand voltage, low leakage current, and low forward voltage drop characteristics, and a method of manufacturing the same.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device including: a first conductive type semiconductor substrate; a first conductive type drift region formed by epitaxial growth over the semiconductor substrate; a plurality of second conductive type vertical implantation regions formed in the drift region by multistage ion implantation, the second conductive type vertical implantation regions having a prescribed vertical implantation width and being at a prescribed distance from each other in the drift region; an anode electrode disposed on a front surface of the drift region opposite to the semiconductor substrate, the anode electrode being in Schottky contact with the drift region and in ohmic contact with the second conductive type vertical implantation regions; and a cathode electrode disposed on a rear surface of the semiconductor substrate opposite to the drift region, the cathode electrode being in ohmic contact with the semiconductor substrate.

In another aspect, the present disclosure provides a method of manufacturing a semiconductor device including: forming an epitaxial growth layer on a substrate; performing multistage ion implantation to form vertical implantation regions in the epitaxial growth layer; performing ion implantation to form field limiting rings in the epitaxial growth layer; performing heat treatment to activate the implanted ions; forming an insulating layer on an entire surface of the epitaxial growth layer; patterning the insulating layer to form a barrier metal on the epitaxial growth layer; forming an anode electrode on the barrier metal; and forming a cathode electrode on a rear surface of the substrate.

According to the present invention it is possible to provide a semiconductor device with improved withstand voltage, low leakage current, and low forward voltage drop characteristics, and a method of manufacturing the same.

It is to be understood that both the foregoing general description and the following detailed description are exemplary and explanatory, and are intended to provide further explanation of the invention as claimed.

BRIEF DESCRIPTION OF THE DRAWINGS

FIG. 13 is a drawing for describing samples (A-1 to A-6) and a reference sample (ref) in which the concentration rate in multistage ion implantation is changed by a fixed quantity in the semiconductor device of the embodiment.

FIG. 14 is a drawing for describing samples (G-1 to G-6) and a reference sample (ref) in which the concentration rate in multistage ion implantation is changed at a fixed rate in the semiconductor device of the embodiment.

DETAILED DESCRIPTION OF THE PREFERRED EMBODIMENTS

Figure 1A:
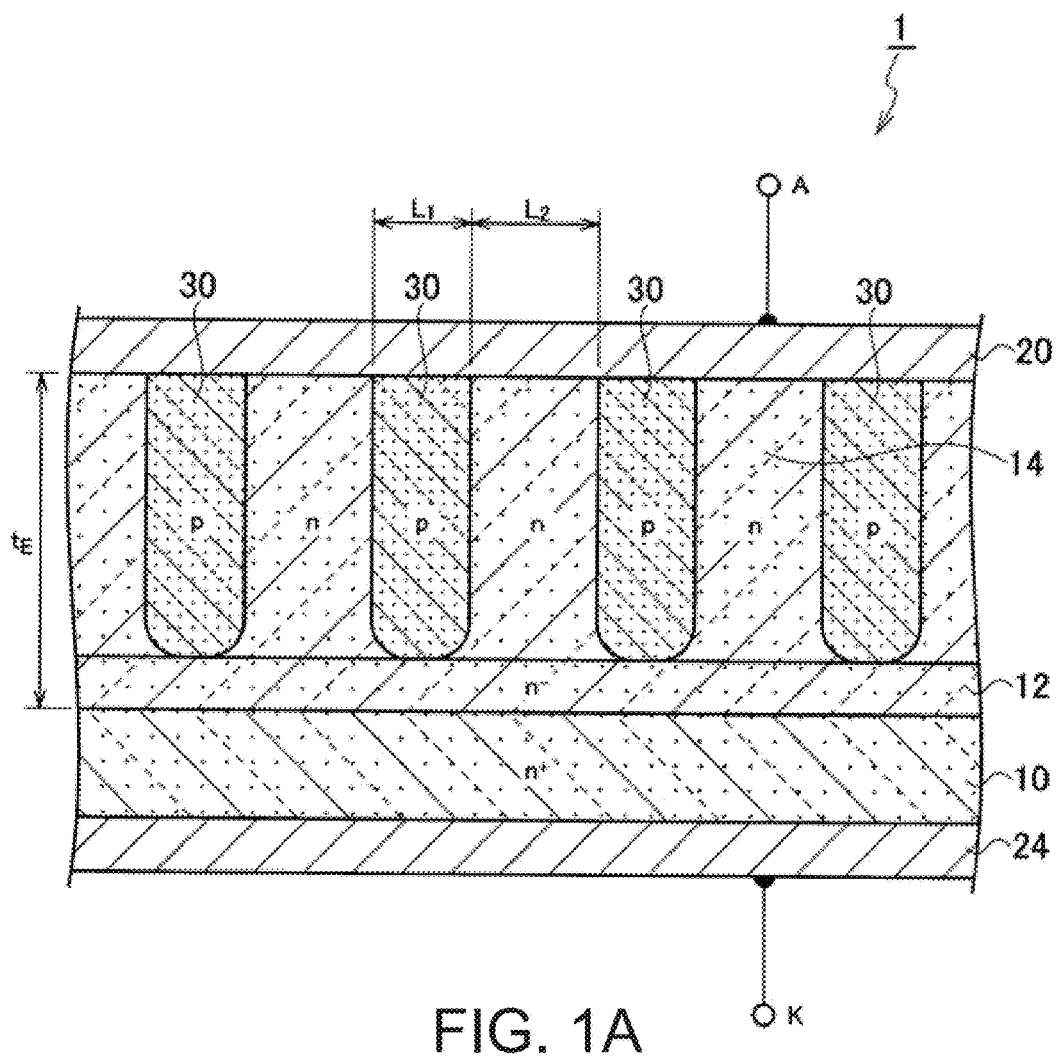
FIG. 1A is a schematic cross-sectional view of a semiconductor device according to an embodiment.

Next, an embodiment will be described with reference to drawings. In the drawings, portions that are the same or similar will be assigned the same or similar reference characters. However, it should be noted that the drawings are schematic, and that the relation between the thickness and planar dimensions and the ratio of thickesses of the respective layers differ from reality. Thus, specific thicknesses and dimensions should be determined based on the description below. Also, there are naturally portions that differ in dimensional relations and ratios in their depiction among different drawings.

The embodiment below describes an apparatus and method to specify the technical ideas of the present invention, and the embodiment of the present invention does not limit the materials, shapes, structures, positions, and the like of the components. The various modifications can be made to the embodiment of the present invention within the scope of the claims.

Figure 1B:
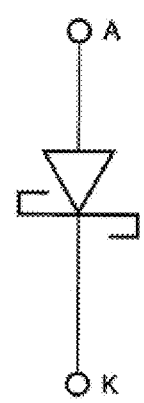
FIG. 1B shows a symbol of the semiconductor device (SBD) of the embodiment.

The schematic cross-sectional structure of a semiconductor device 1 of an embodiment is as shown in FIG. 1A, and the symbols used for the semiconductor device 1 of the embodiment are as shown in FIG. 1B.

Figure 2A:
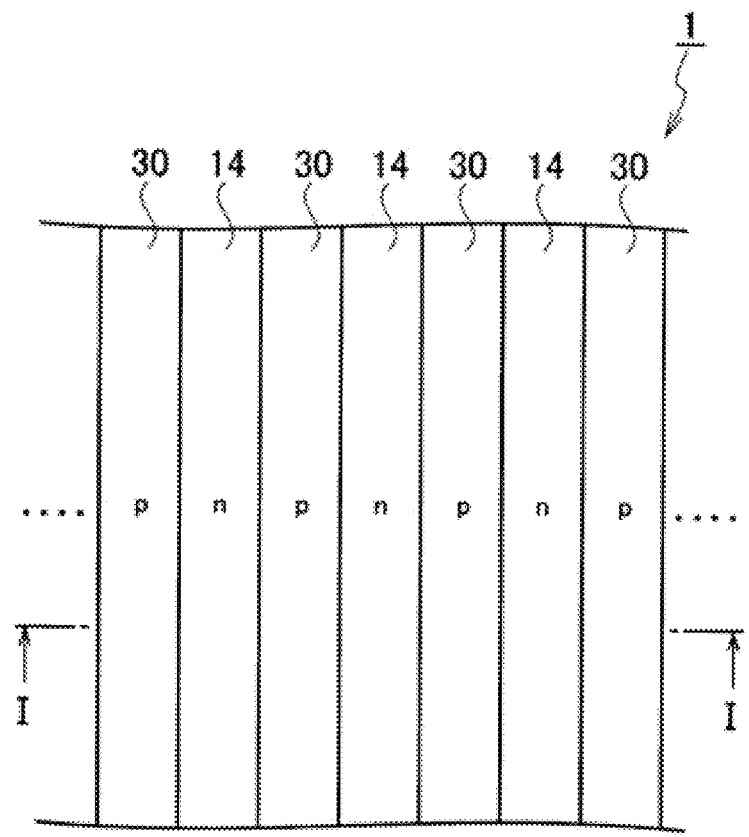
FIG. 2A is a schematic plan view of a pattern of the semiconductor device of the embodiment.
Figure 2B:
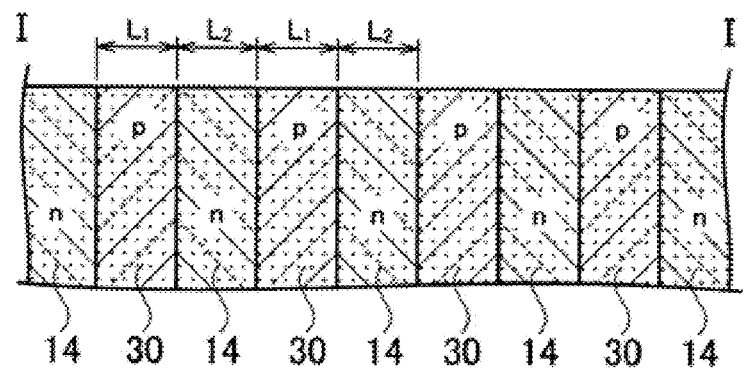
FIG. 2B is a schematic cross-sectional view of FIG. 2A along the line I-I.

A schematic plan view of a pattern of the semiconductor device 1 of the embodiment is as shown in FIG. 2A, and a schematic cross-sectional view of FIG. 2A along the line I-I is as shown in FIG. 2B.

Figure 3A:
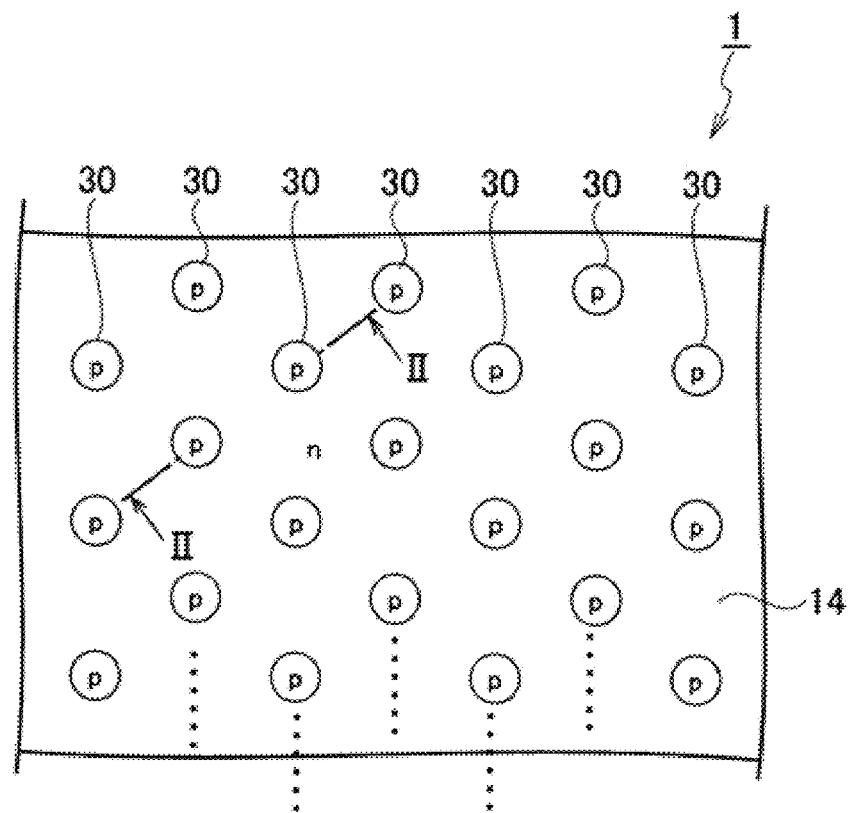
FIG. 3A is another schematic plan view of a pattern of the semiconductor device of the embodiment.
Figure 3B:
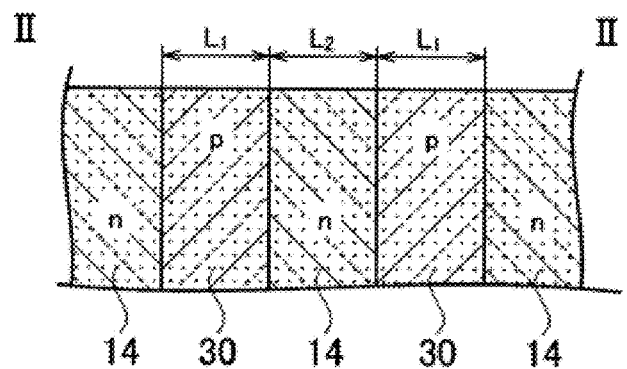
FIG. 3B is a schematic cross-sectional view of FIG. 3A along the line II-II.

Another schematic plan view of a pattern of the semiconductor device 1 of the embodiment is as shown in FIG. 3A, and a schematic cross-sectional view of FIG. 3A along the line II-II is as shown in FIG. 3B.

As shown in FIGS. 1 to 3, the semiconductor device 1 of the embodiment includes: a first conductive-type semiconductor substrate 10; a first conductive-type drift region 14 formed by epitaxial growth on the semiconductor substrate 10; a plurality of second conductive-type vertical implantation regions 30 formed in the drift region 14 by multistage ion implantation, the second conductive-type vertical implantation regions 30 having a prescribed first vertical implantation width $L_1$ and a prescribed drift region width $L_2$; an anode electrode 20 that is disposed on the front surface of the drift region 14 opposite to the semiconductor substrate 10, the anode electrode 20 being in Schottky contact with the drift region 14 and in ohmic contact with the second conductive-type vertical implantation region 30; and a cathode electrode 24 disposed on the rear surface of the semiconductor substrate 10 opposite to the drift region 14, the cathode electrode 24 being in ohmic contact with the semiconductor substrate 10.

As shown in FIG. 1, the anode electrode 20 is in contact with an anode terminal A, and the cathode electrode 24 is in contact with a cathode terminal K.

The vertical implantation regions 30 may be formed in the drift region 14 in stripes as shown in FIGS. 2A and 2B, or in circular dot patterns as shown in FIGS. 3A and 3B.

As shown in FIGS. 2B and 3B, the vertical implantation regions 30 formed in the drift region 14 have a prescribed vertical implantation width $L_1$ and a prescribed drift region width $L_2$, and the pitch of the vertical implantation regions 30 is expressed as $L_1+L_2$.

As shown in FIG. 1A, the semiconductor device 1 of the embodiment may include a first conductive-type high resistance layer 12 formed by epitaxial growth on the semiconductor substrate 10, and the drift region 14 may be disposed on the high resistance layer 12. The first conductive-type high resistance layer 12 is not necessarily required. The semiconductor device 1 of the embodiment can be given a relatively high withstand voltage by the inclusion of the high resistance layer 12 as shown in FIG. 1A.

In the semiconductor device 1 of the embodiment, the multistage ion implantation includes two or more steps.

In the semiconductor device 1 of the embodiment, the multistage ion implantation may include four steps, and acceleration energies may respectively be 2 MeV, 1.1 MeV, 500 keV, and 100 keV.

In the semiconductor device 1 of the embodiment, the dose when the acceleration energy is 100 keV may be approximately $4 \times 10^{12}$ atoms/cm$^2$ to approximately $8 \times 10^{12}$ atoms/cm$^2$, for example. Boron (B) can be used as the impurity ion, for example.

Also, in the semiconductor device 1 of the embodiment, the dose for when the acceleration energy is 500 keV, 1.1 MeV, or 2 MeV may have concentration rates at fixed quantities that are approximately 5% to 30% lower than the dose for when the acceleration energy is 100 keV.

Also, in the semiconductor device 1 of the embodiment, the dose for when the acceleration energy is 500 keV, 1.1 MeV, or 2 MeV may have fixed concentration rates that are approximately 5% to 30% lower, for example, than the dose for when the acceleration energy is 100 keV.

In the semiconductor device 1 of the embodiment, the thickness of the drift region 14 formed by epitaxial growth may be approximately 7 μm to approximately 9 μm, for example.

In the semiconductor device 1 of the embodiment, the resistivity of the drift region 14 formed by epitaxial growth may be approximately 0.7 Ωcm, for example.

In the semiconductor device 1 of the embodiment, the drive temperature and drive time after multistage ion implantation may be respectively 1050° C. to 1150° C., and approximately 30 minutes, for example.

In the semiconductor device 1 of the embodiment, the vertical implantation width $L_1$ may be approximately 0.8 μm to approximately 1.0 μm, for example.

In the semiconductor device 1 of the embodiment, the drift region width $L_2$ may be approximately 3.0 μm to approximately 3.2 μm, for example.

(Comparison Examples)

Figure 4:
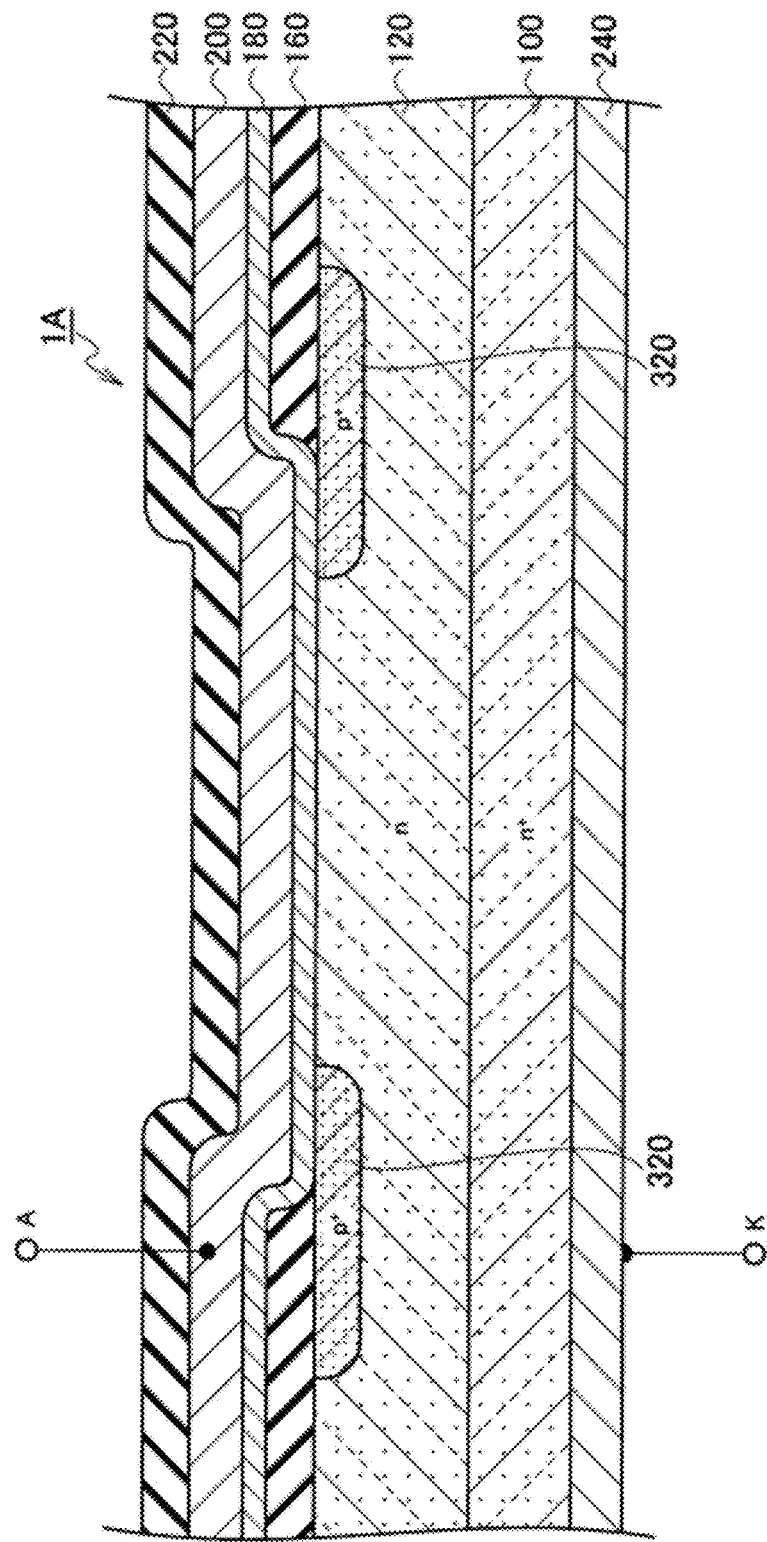
FIG. 4 is a schematic cross-sectional view of an SBD of Comparison Example 1.

As shown in FIG. 4, an SBD 1A includes: a first conductive type semiconductor substrate 100; a first conductive type semiconductor layer 120 formed by epitaxial growth on the semiconductor substrate 100; a second conductive type guard ring diffusion layer 320 formed on the surface of the semiconductor layer 120; an insulating layer 160 disposed on the front surface of the semiconductor layer 120; a base electrode layer 180 disposed on the semiconductor layer 120 and insulating layer 160 surrounded by the guard ring diffusion layer 320, the base electrode layer 180 being in Schottky contact with the semiconductor layer 120; an anode electrode 200 disposed on the base electrode layer 180; an insulating layer 220 disposed on the anode electrode 200; and a cathode electrode 240 disposed on the rear surface of the semiconductor substrate 100 opposite to the semiconductor layer 120, the cathode electrode 240 being in ohmic contact with the semiconductor substrate 100.

The base electrode layer 180 is made of Mo, and the anode electrode 200 is made of TiAl. The anode electrode 200 is connected to an anode terminal A, and the cathode electrode 240 is connected to the cathode terminal K.

Figure 5:
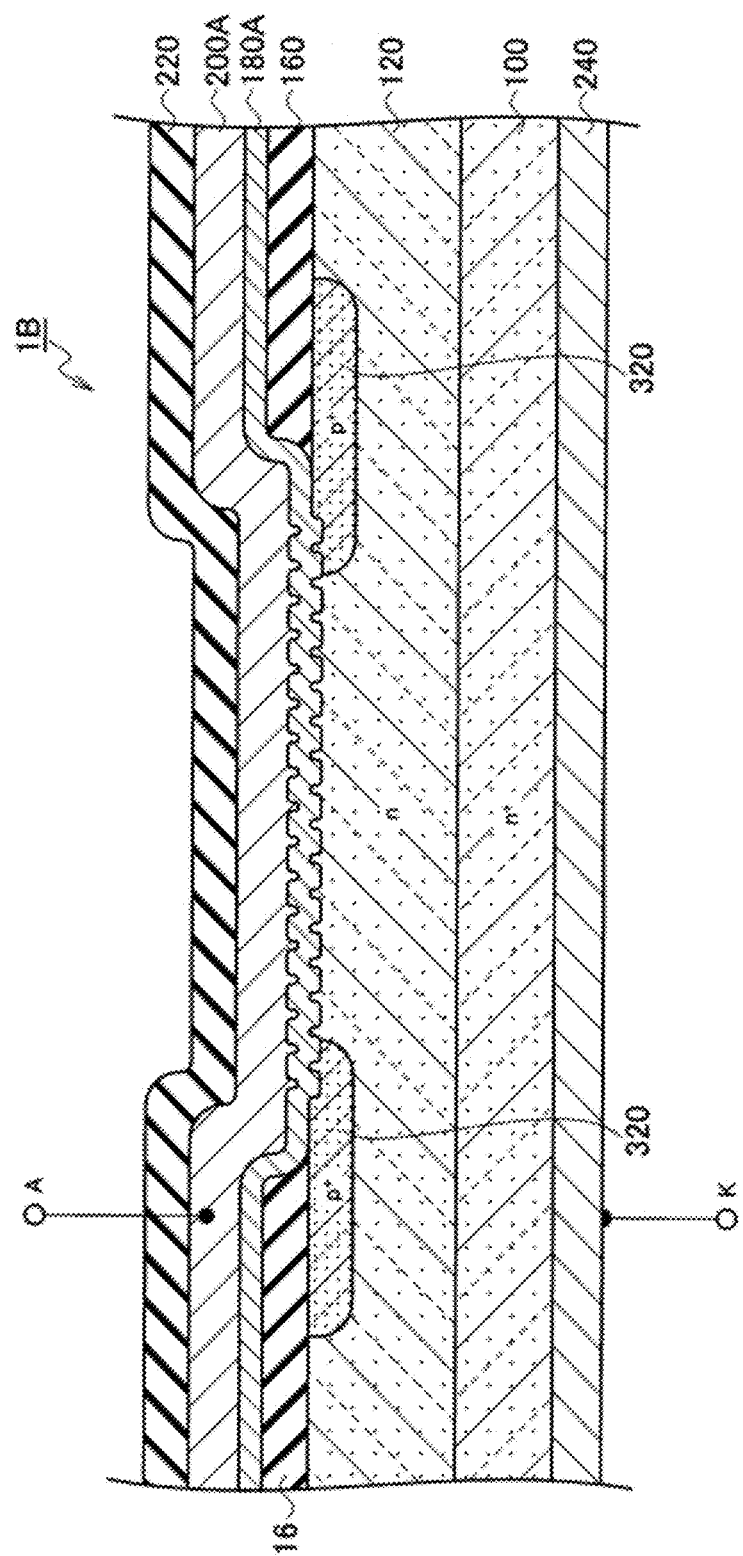
FIG. 5 is a schematic cross-sectional view of an SBD of Comparison Example 2.

As shown in FIG. 5, an SBD 1B of Comparison Example 2 includes: a first conductive type semiconductor substrate 100; a first conductive type semiconductor layer 120 formed by epitaxial growth on the semiconductor substrate 100; a second conductive type guard ring diffusion layer 320 formed on the surface of the semiconductor layer 120; an insulating layer 160 disposed on the front surface of the semiconductor layer 120; a base electrode layer 180A disposed on the semiconductor layer 120 and insulating layer 160 surrounded by the guard ring diffusion layer 320, the base electrode layer 180A being in Schottky contact with the semiconductor layer 120; an anode electrode 200A disposed on the base electrode layer 180A; an insulating layer 220 disposed on the anode electrode 200A; and a cathode electrode 240 disposed on the rear surface of the semiconductor substrate 100 opposite to the semiconductor layer 120, the cathode electrode 240 being in ohmic contact with the semiconductor substrate 100.

The base electrode layer 180A is made of Mo/Ti in that order from the semiconductor layer 120, and the anode electrode 200A is made of AlCu.

The SBD 1B according to Comparison Example 2, as shown in FIG. 5 has a step structure on the surface of the semiconductor layer 120, which increases the contact area between the base electrode layer 180A and the semiconductor layer 120, which are in Schottky contact.

Figure 6:
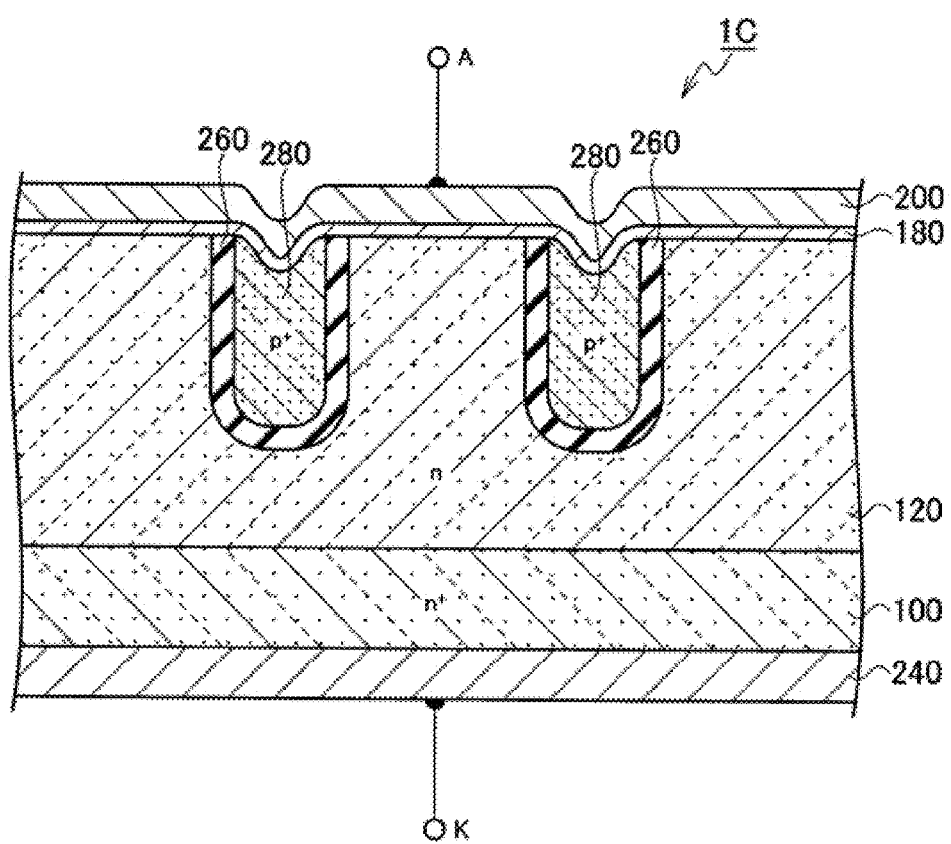
FIG. 6 is a schematic cross-sectional view of an SBD of Comparison Example 3.

As shown in FIG. 6, an SBD 1C according to Comparison Example 3 includes: a first conductive type semiconductor substrate 100; a first conductive type semiconductor layer 120 formed by epitaxial growth on the semiconductor substrate 100; a second conductive type guard ring diffusion layer 320 formed on the surface of the semiconductor layer 120; an insulating layer 260 formed on an inner wall of a trench formed in the surface of the semiconductor layer 120; a second conductive type polysilicon region 280 disposed on the insulating layer 260 and that fills the trench; an anode electrode 200C disposed on the insulating layer 260, the polysilicon region 280, and the semiconductor layer 120, the anode electrode 200C being in ohmic contact with the polysilicon region 280 and in Schottky contact with the semiconductor layer 120; and a cathode electrode 240 disposed on the rear surface of the semiconductor substrate 100 opposite to the semiconductor layer 120, the cathode electrode 240 being in ohmic contact with the semiconductor substrate 100.

Figure 7A:
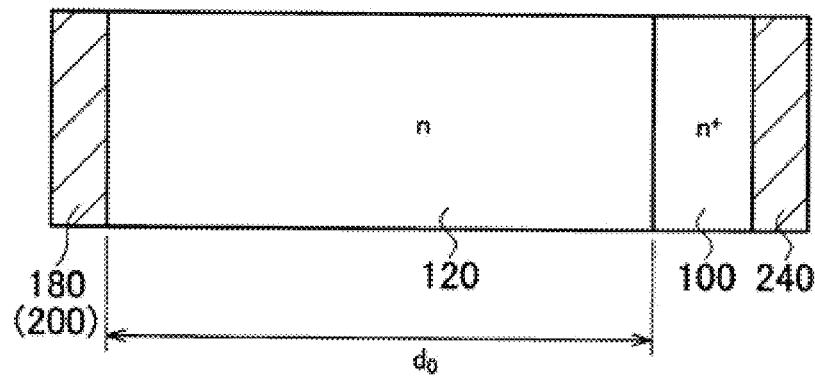
FIG. 7A is a schematic view of an Mnn+ structure of an SBD of a comparison example.
Figure 7B:
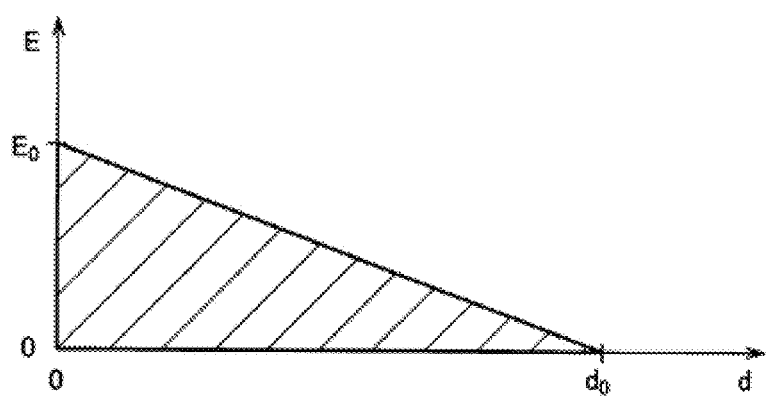
FIG. 7B is a schematic view of an electric field distribution in FIG. 7A.

The Mnn$^+$ structure of the SBDs of the comparison examples are schematically shown in FIG. 7A, and the electric field distribution in the semiconductor layer 120 of FIG. 7A is schematically shown in FIG. 7B. Here, the thickness of the semiconductor layer 120 is $d_0$. The M (180/180 A)/n (semiconductor layer 120)/n$^+$ (semiconductor substrate 100) structure corresponds to the SBD portions of FIGS. 4 to 6. As shown in FIG. 7B, in the SBDs of the comparison examples, the electric field distribution decreases gradually from anode to cathode.

Figure 8A:
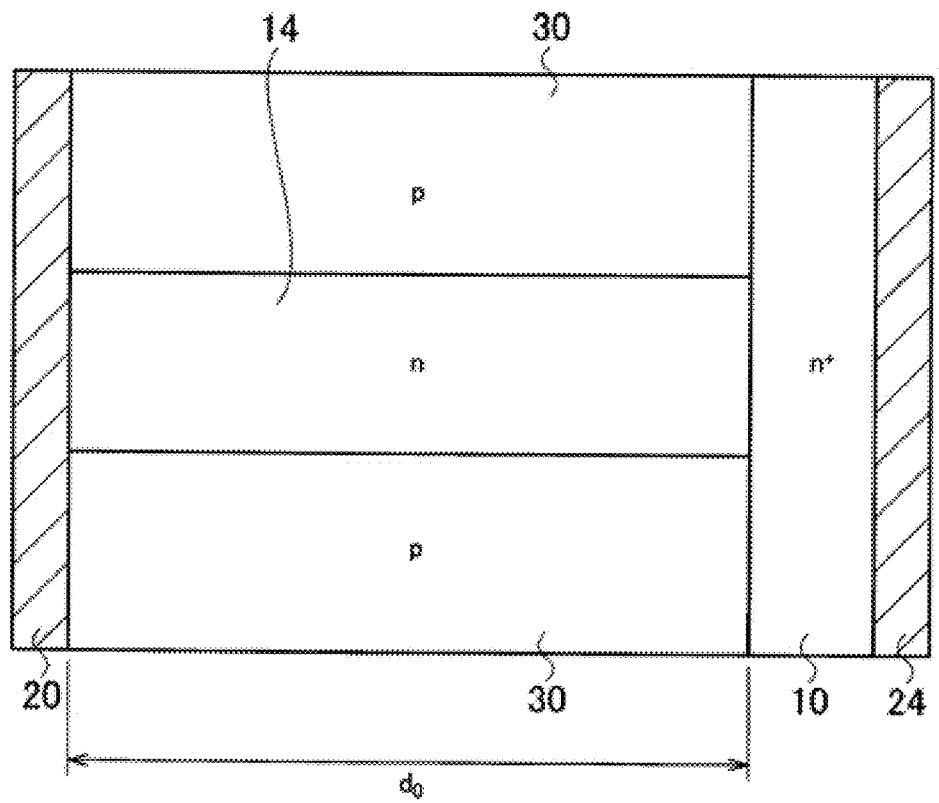
FIG. 8A is a schematic view of the SJ structure of the semiconductor device of the embodiment.
Figure 8B:
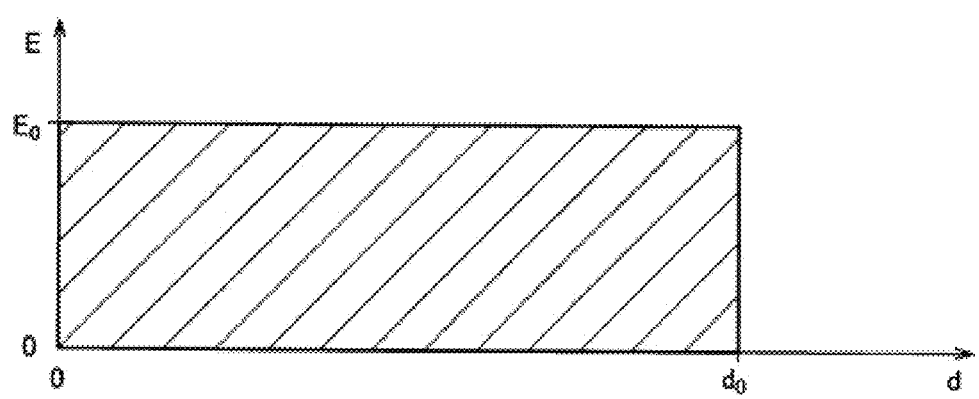
FIG. 8B is a view of the electric field distribution in FIG. 8A.

The SJ structure of the semiconductor device 1 of the embodiment is shown schematically in FIG. 8A, and the electric field distribution in the drift region 14 of FIG. 8A is schematically shown in FIG. 8B. Here, the thickness of the drift region 14 is $d_0$. As shown in FIG. 8B, in the semiconductor device of the embodiment, the electric field distribution is substantially even from anode to cathode.

The areas of the portions with slanted line patterns in FIGS. 7B and 8B correspond to the voltages. Thus, in the semiconductor device of the embodiment, a higher withstand voltage can be attained in the drift region 14 with the same thickness as the thickness $d_0$ of the semiconductor layer 120, compared to the SBDs of the comparison examples.

(Multistage Ion Implantation)

Figure 9:
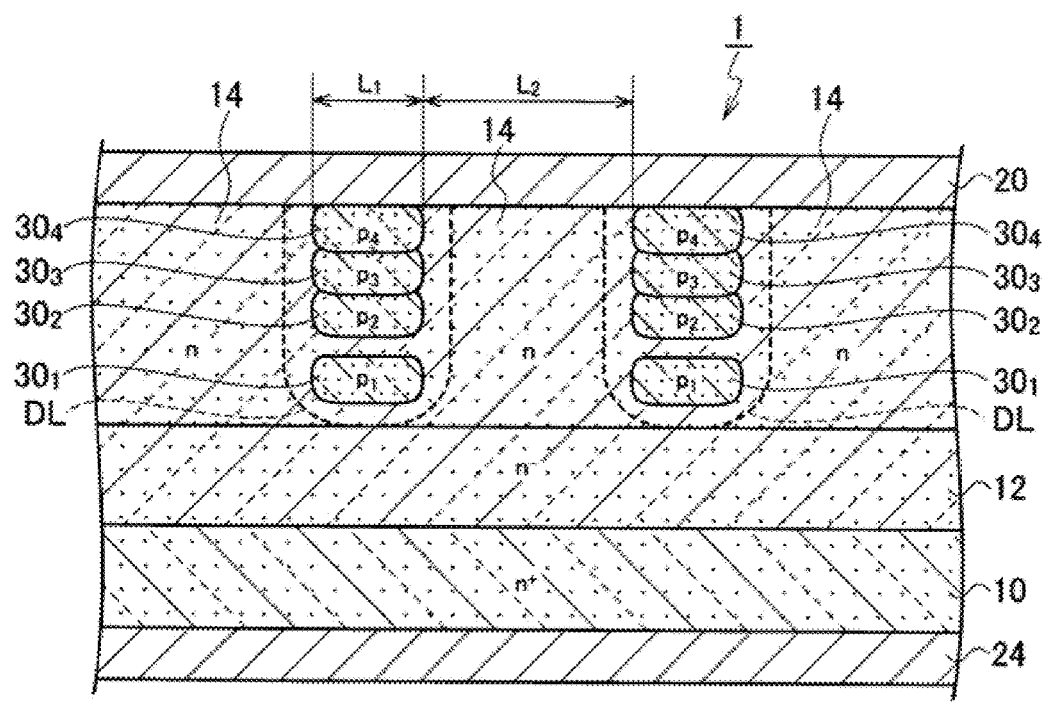
FIG. 9 is a schematic cross-sectional view of a semiconductor device of the embodiment formed by four stage ion implantation.
Figure 10:
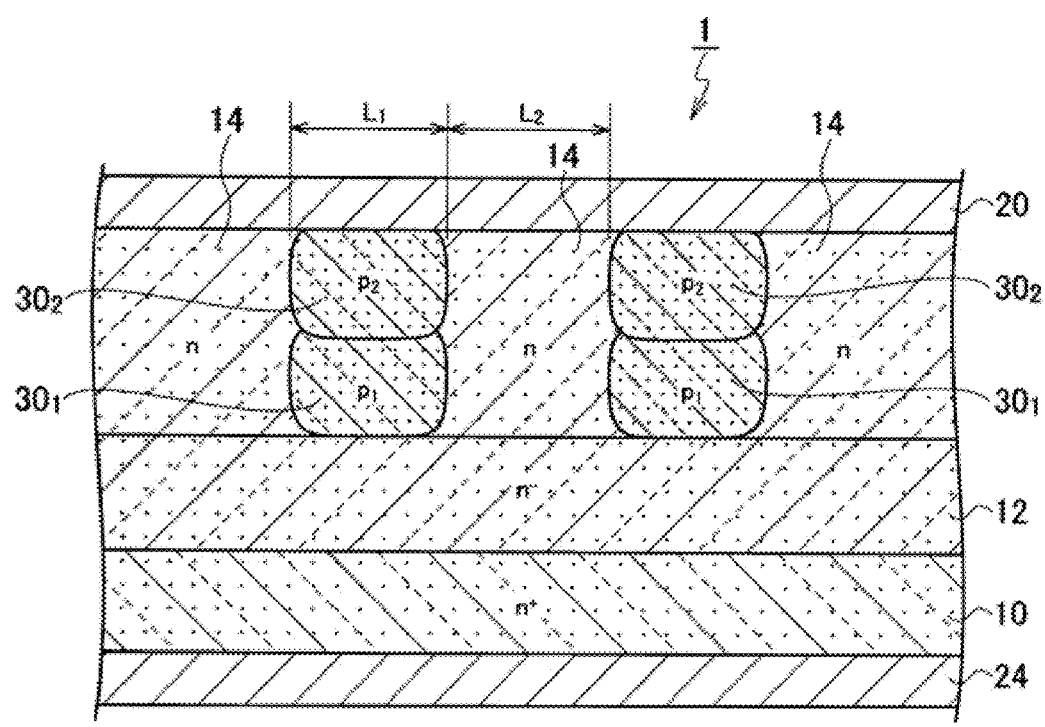
FIG. 10 is a schematic cross-sectional view of a semiconductor device of the embodiment formed by two stage ion implantation.

The schematic cross-sectional structure of the semiconductor device 1 of the embodiment formed by four stage ion implantation is shown in FIG. 9, and the schematic cross-sectional structure of the semiconductor device 1 of the embodiment formed by two stage ion implantation is shown in FIG. 10.

As shown in FIG. 9, it is possible to form a $p_1$ region $30_1$, a $p_2$ region $30_2$, a $p_3$ region $30_3$, and a $p_4$ region $30_4$ corresponding to acceleration energies $V_1$, $V_2$, $V_3$, and $V_4$ during the four stage ion implantation. Here, the acceleration energies satisfy the following relation: $V_1>V_2>V_3>V_4$ Similarly, in FIG. 10, it is possible to form a $p_1$ region $30_1$ and a $p_2$ region $30_2$ corresponding to acceleration energies $V_1$ and $V_2$. Here, the acceleration energies satisfies a relation of $V_1>V_2$. In FIG. 9, DL indicates a region where a depletion layer has spread from the p vertical implantation region ($30_1$, $30_2$, $30_3$, $30_4$) in the drift region 14. The width of the depletion layer spread region DL changes depending on the impurity concentration of the p vertical implantation region ($30_1$, $30_2$, $30_3$, $30_4$) and the n drift region, and the n drift region width $L_2$ (Si mesa width). The portion of the n drift region 14 sandwiched between the p vertical implantation regions ($30_1$, $30_2$, $30_3$, $30_4$) may be completely depleted.

Figure 11A:
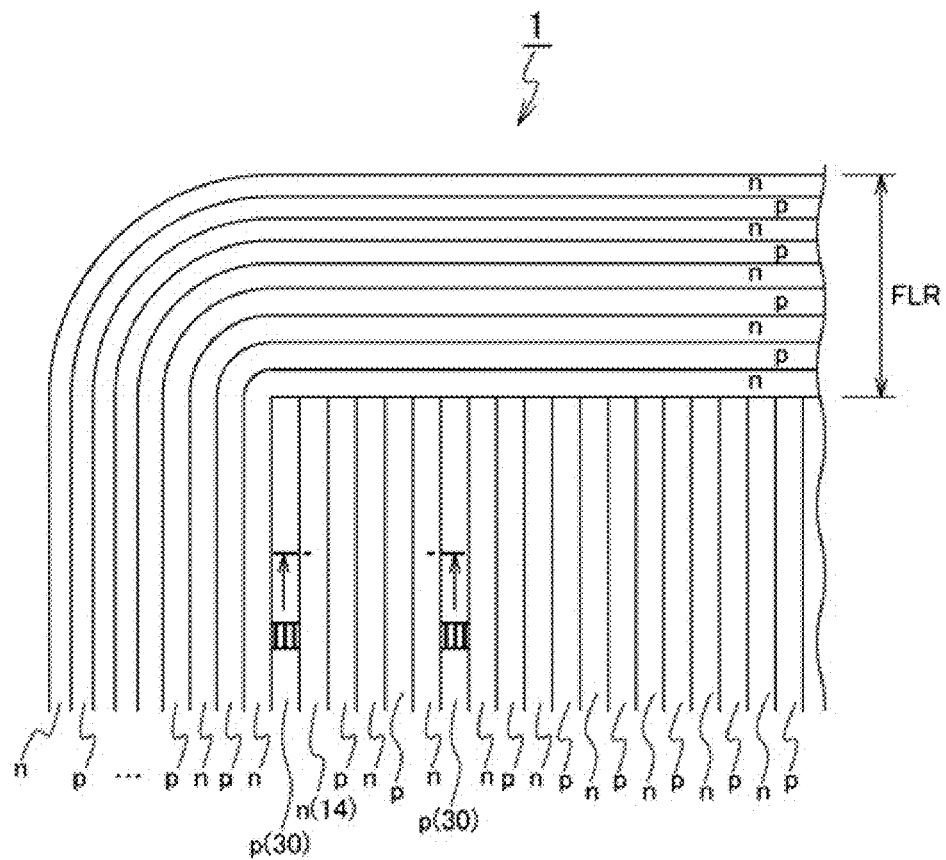
FIG. 11A is a schematic plan view of a pattern of the semiconductor device of the embodiment formed by four stage ion implantation.
Figure 11B:
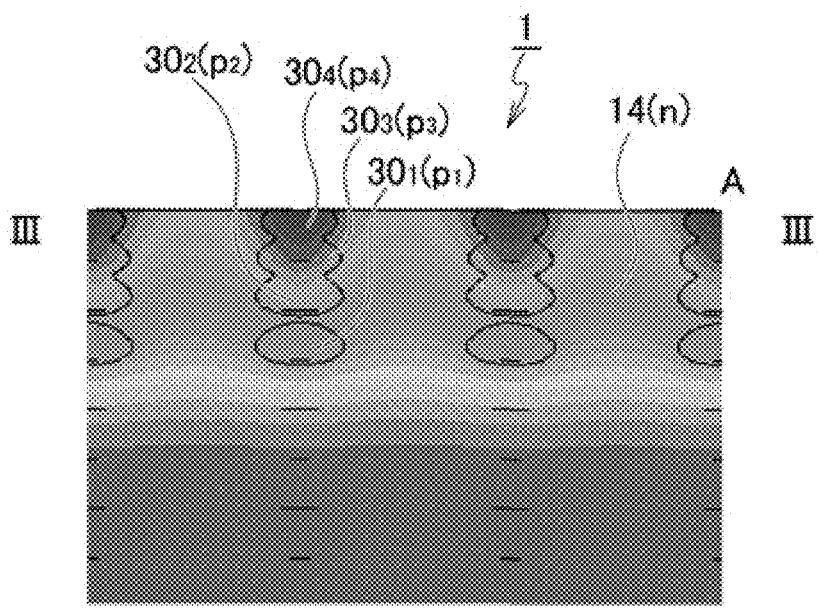
FIG. 11B shows the result of electromagnetic field simulation of the cross-section of FIG. 11A along the line III-III.
Figure 12:
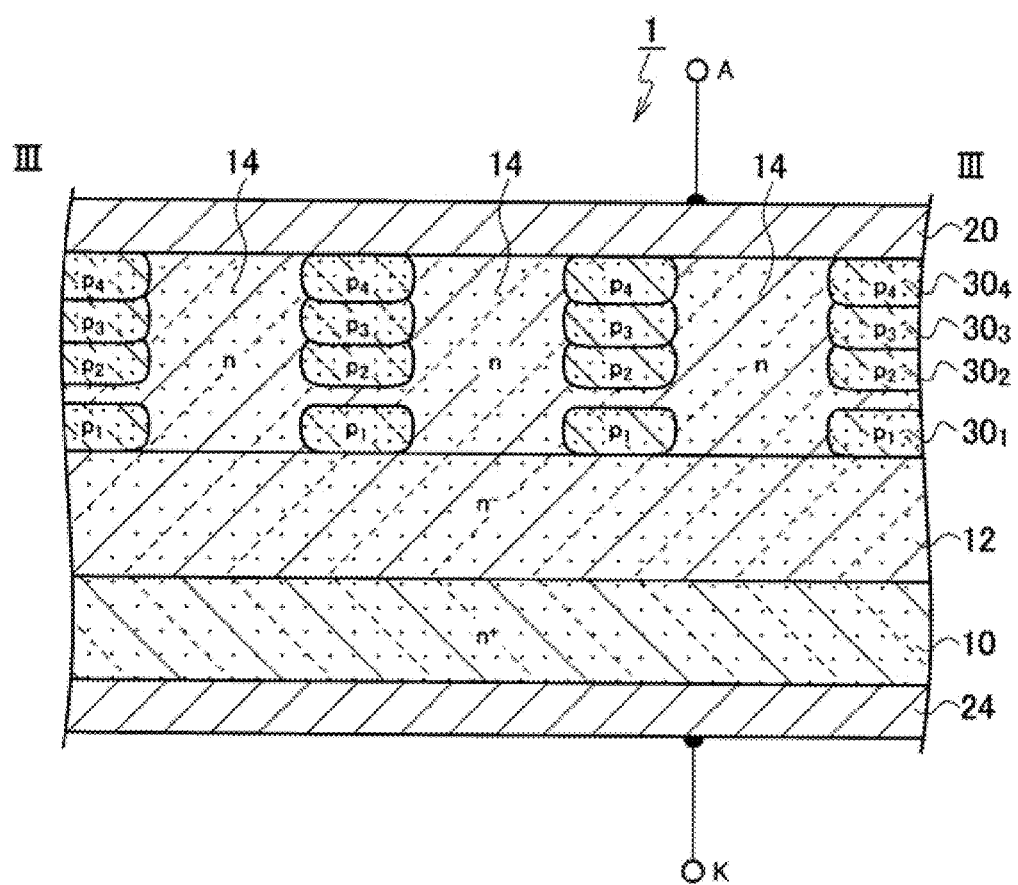
FIG. 12 is a schematic cross-sectional view of FIG. 11A along the line III-III.

The schematic plan view pattern of the semiconductor device 1 of the embodiment formed by four stage ion implantation is shown in FIG. 11A. The result of electromagnetic field simulation in the cross-section along the line III-III of FIG. 11A is as shown in FIG. 11B. In addition, the schematic cross-sectional structure along the line III-III of FIG. 11A is shown in FIG. 12.

(Concentration Rate of Multistage Ion Implantation)

In the semiconductor device of the embodiment, the trend of the withstand voltage BV under the multistage ion implantation condition was studied. Here, the thickness of the n drift region 14 (epilayer thickness) was set to 8 μm and the resistivity of the n drift region 14 was set to 0.7 Ωcm. The p vertical implantation width $L_1$ was set to 1.0 μm and the n drift region width $L_2$ (Si mesa width) was set to 3.0 μm. The acceleration energies in the multistage ion implantation (ion implantation angle: 7°) to form the p vertical implantation regions $30_1$, $30_2$, $30_3$, and $30_4$ were set to 2 MeV, 1.1 MeV, 500 keV, and 100 keV. The doses at 100 keV were set to $4.0\times10^{12}$ atoms/cm$^2$, $6.0\times10^{12}$ atoms/cm$^2$, and $8.0\times10^{12}$ atoms/cm$^2$. The diffusion drive temperature and time were respectively set to 1000° C. and 30 minutes.

The description of samples (A-1 to A-6) and a reference sample (ref) in which the concentration rate in multistage ion implantation is changed by a fixed quantity in the semiconductor device of the embodiment is as shown in FIG. 13.

The reference sample (ref) has the same concentration rate for the dose in the multistage ion implantation for 100 keV, 500 keV, 1.1 MeV, and 2 MeV. That is, the doses are set equal to that of 100 keV.

By contrast, in the A-1 sample, the concentration rates in the multistage ion implantation are changed by a fixed quantity of −5% each, and the concentration rates for the doses at 100 keV, 500 keV, 1.1 MeV, and 2 MeV are respectively 1.00, 0.95, 0.90, and 0.85.

In the A-2 sample, the concentration rates in the multistage ion implantation are changed by a fixed quantity of −10% each, and the concentration rates for the doses at 100 keV, 500 keV, 1.1 MeV, and 2 MeV are respectively 1.00, 0.90, 0.80, and 0.70.

In the A-3 sample, the concentration rates in the multistage ion implantation are changed by a fixed quantity of −15% each, and the concentration rates for the doses at 100 keV, 500 keV, 1.1 MeV, and 2 MeV are respectively 1.00, 0.85, 0.70, and 0.55.

In the A-4 sample, the concentration rates in the multistage ion implantation are changed by a fixed quantity of −20% each, and the concentration rates for the doses at 100 keV, 500 keV, 1.1 MeV, and 2 MeV are respectively 1.00, 0.80, 0.60, and 0.40.

In the A-5 sample, the concentration rates in the multistage ion implantation are changed by a fixed quantity of −25% each, and the concentration rates for the doses at 100 keV, 500 keV, 1.1 MeV, and 2 MeV are respectively 1.00, 0.75, 0.50, and 0.25.

In the A-6 sample, the concentration rates in the multistage ion implantation are changed by a fixed quantity of −30% each, and the concentration rates for the doses at 100 keV, 500 keV, 1.1 MeV, and 2 MeV are respectively 1.00, 0.70, 0.40, and 0.10.

The description of samples (G-1 to G-6) and a reference sample (ref) in which the concentration rate in multistage ion implantation is changed at a fixed rate in the semiconductor device of the embodiment is as shown in FIG. 14.

The reference sample (ref) has the same concentration rate for the dose in the multistage ion implantation for 100 keV, 500 keV, 1.1 MeV, and 2 MeV. That is, the doses are set equal to that of 100 keV.

By contrast, in the G-1 sample, the concentration rates in the multistage ion implantation are changed at a fixed rate of 0.95 times each, and the concentration rates for the doses at 100 keV, 500 keV, 1.1 MeV, and 2 MeV are respectively 1.00, 0.95, $0.95^2$, and $0.95^3$.

In the G-2 sample, the concentration rates in the multistage ion implantation are changed at a fixed rate of 0.90 times each, and the concentration rates for the doses at 100 keV, 500 keV, 1.1 MeV, and 2 MeV are respectively 1.00, 0.90, $0.90^2$, and $0.90^3$.

In the G-3 sample, the concentration rates in the multistage ion implantation are changed at a fixed rate of 0.85 times each, and the concentration rates for the doses at 100 keV, 500 keV, 1.1 MeV, and 2 MeV are respectively 1.00, 0.85, $0.85^2$, and $0.85^3$.

In the G-4 sample, the concentration rates in the multistage ion implantation are changed at a fixed rate of 0.80 times each, and the concentration rates for the doses at 100 keV, 500 keV, 1.1 MeV, and 2 MeV are respectively 1.00, 0.80, $0.80^2$, and $0.80^3$.

In the G-5 sample, the concentration rates in the multistage ion implantation are changed at a fixed rate of 0.75 times each, and the concentration rates for the doses at 100 keV, 500 keV, 1.1 MeV, and 2 MeV are respectively 1.00, 0.75, $0.75^2$, and $0.75^3$.

In the G-6 sample, the concentration rates in the multistage ion implantation are changed at a fixed rate of 0.70 times each, and the concentration rates for the doses at 100 keV, 500 keV, 1.1 MeV, and 2 MeV are respectively 1.00, 0.70, $0.70^2$, and $0.70^3$.

Figure 15:
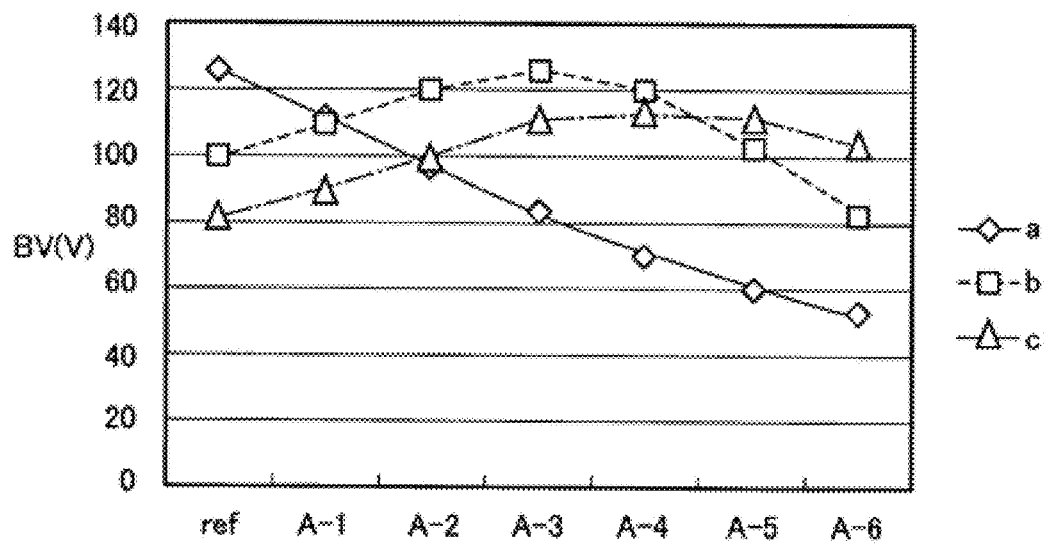
FIG. 15 shows dependencies of a withstand voltage BV on ref concentrations (a, b, c) in relation to samples (A-1 to A-6) in which the concentration rate is changed by a fixed quantity in the multistage ion implantation in the semiconductor device of the embodiment.
Figure 16:
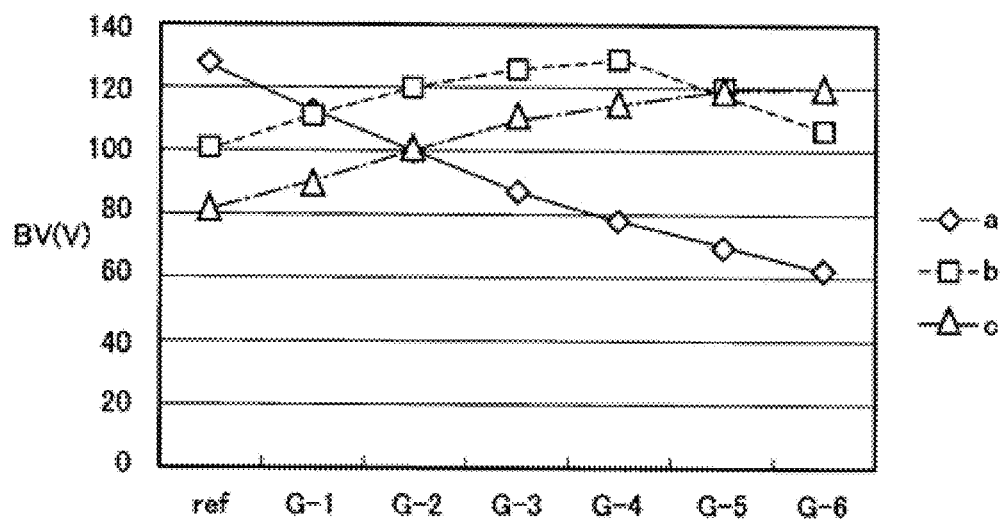
FIG. 16 shows dependencies of a withstand voltage BV on ref concentrations (a, b, c) in relation to samples (G-1 to G-6) in which the concentration rate is changed at a fixed rate in the multistage ion implantation in the semiconductor device of the embodiment.

In the semiconductor device of the embodiment, the dependencies of the withstand voltage BV on the ref concentrations a, b, and c with respect to the samples (A-1 to A-6) in which the concentration rate in the multistage ion implantation is changed by a fixed quantity is as shown in FIG. 15, and the dependencies of the withstand voltage BV on the ref concentrations a, b, and c with respect to the samples (G-1 to G6) in which the concentration rate in the multistage ion implantation is changed at a fixed rate is as shown in FIG. 16. The ref concentrations a, b, and c are impurity concentrations in the p vertical implantation regions 30 corresponding to doses of $4\times10^{12}$ atoms/cm², $6\times10^{12}$ atoms/cm², and $8\times10^{12}$ atoms/cm² at an acceleration energy of 100 keV, for example.

By the results of FIGS. 15 and 16, a peak withstand voltage BV of approximately 120V to 130V is obtained. That is, in the A-3 sample at a ref concentration of b, a withstand voltage BV of greater than or equal to approximately 120V is attained, and in the G-4 sample at a ref concentration of b, a withstand voltage BV of greater than or equal to 120V is attained.

(Physical Quantity Distribution just under Withstand Voltage (100 keV; Dose $6.0\times10^{12}$ Atoms/Cm²))

Figure 17:
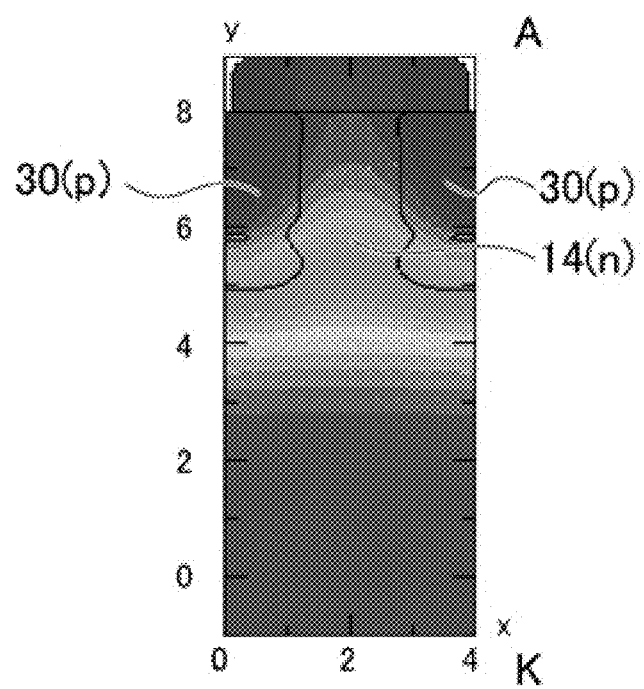
FIG. 17 shows simulation results of electric potential distributions in the reference samples in the semiconductor device of the embodiment.

In the semiconductor device of the embodiment, the simulation results of the electric potential distribution of the reference sample (ref) at an applied voltage of just under the withstand voltage (96V) is as shown in FIG. 17.

Figure 18:
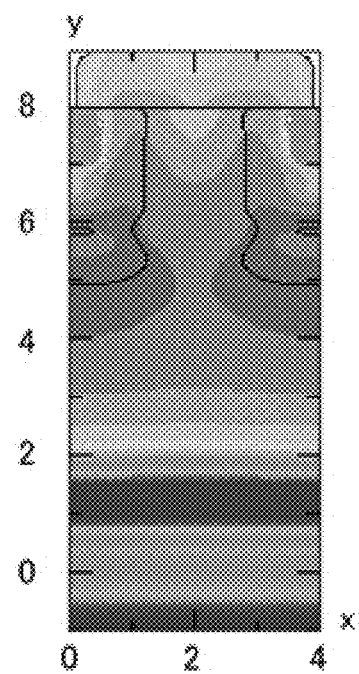
FIG. 18 shows simulation results of electric field distributions in the reference samples in the semiconductor device of the embodiment.

The simulation results for the electric field distribution under the same conditions are as shown in FIG. 18.

(Dependency of Withstand Voltage on Epilayer Thickness/Ref Concentration)

The dependency of the withstand voltage BV on the epilayer thickness and the ref concentration was studied in the semiconductor device of the embodiment. The epilayer thicknesses $t_E$ were set to x, y, and z, and the ref concentrations were set to a, b, and c. The epilayer thicknesses x, y, and z were respectively approximately 7 µm, 8 µm, and 9 µm, with the resistivity of the n drift region 14 being 0.7 Ωcm, for example. The p vertical implantation width $L_1$/n drift region width $L_2$ (Si mesa width) were set to 1.0 µm/3.0 µm and 0.8 µm/3.2 µm. The acceleration energies in the multistage ion implantation (ion implantation angle: 7°) to form the p vertical implantation regions $30_1$, $30_2$, $30_3$, and $30_4$ were set to 2 MeV, 1.1 MeV, 500 keV, and 100 keV. The doses at 100 keV were set to $4.0\times10^{12}$ atoms/cm², $6.0\times10^{12}$ atoms/cm², and $8.0\times10^{12}$ atoms/cm², for example. The ref concentrations a, b, and c are impurity concentrations in the p vertical implantation regions 30 corresponding to doses of $4\times10^{12}$ atoms/cm², $6\times10^{12}$ atoms/cm², and $8\times10^{12}$ atoms/cm² at an acceleration energy of 100 keV, for example. The diffusion drive temperature and time were respectively set to 1000° C. and 30 minutes.

Figure 19:
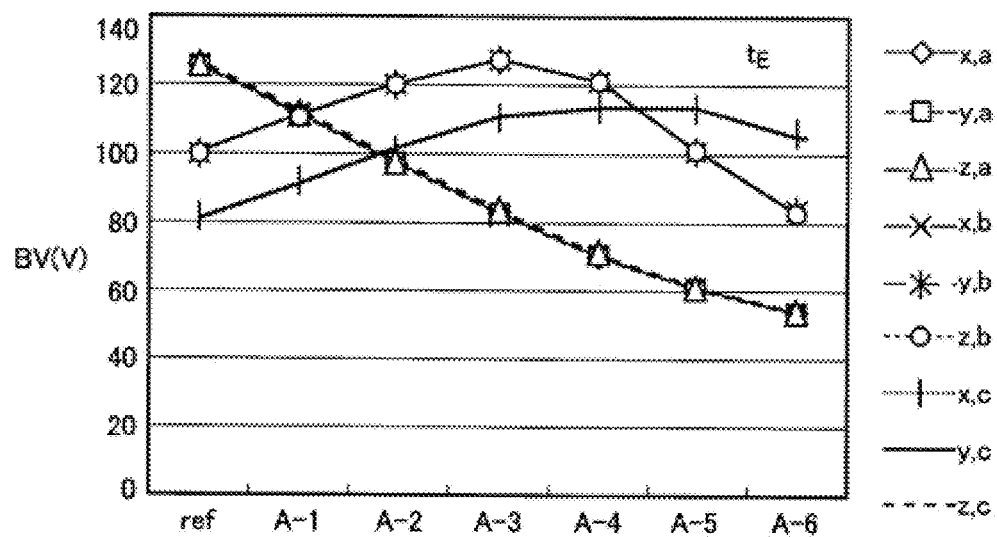
FIG. 19 shows dependencies of a withstand voltage BV on epilayer thicknesses (x, y, z) and ref concentrations (a, b, c) in relation to samples (A-1 to A-6) in which the concentration rate is changed by a fixed quantity in the multistage ion implantation in the semiconductor device of the embodiment.

The dependency of the withstand voltage BV on the epilayer thicknesses (x, y, z) and ref concentrations (a, b, c) in relation to samples (A-1 to A-6) in which the concentration rate is changed by a fixed quantity in the multistage ion implantation in the semiconductor device of the embodiment is as shown in FIG. 19.

As shown in FIG. 19, when the epilayer thickness is y, the dependency of the withstand voltage BV on the ref concentrations a, b, and c is almost unaffected.

(Dependency of Withstand Voltage on p Vertical Implantation Width/Dose)

Figure 20:
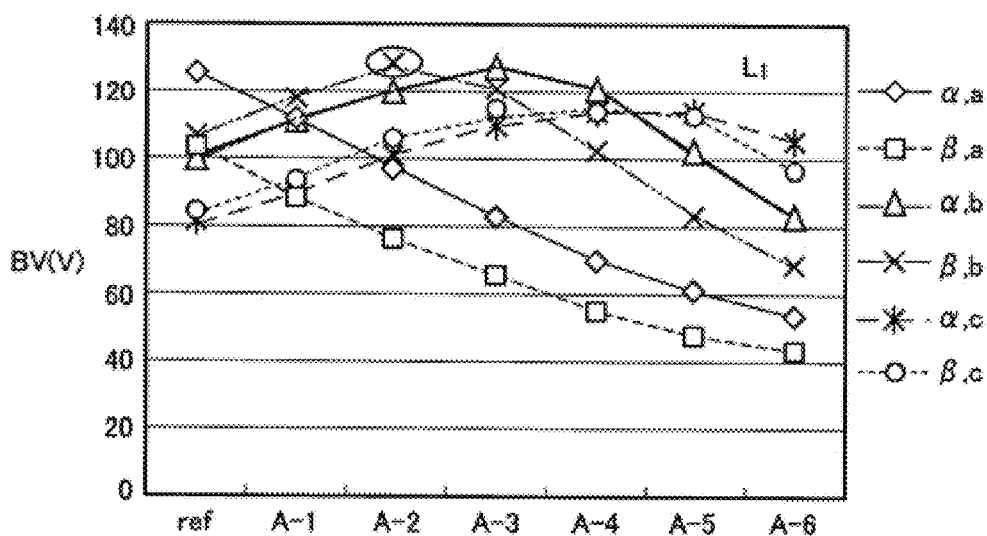
FIG. 20 shows dependencies of a withstand voltage BV on p vertical implantation width ($\alpha$, $\beta$) and ref concentrations (a, b, c) in relation to samples (A-1 to A-6) in which the concentration rate is changed by a fixed quantity in the multistage ion implantation (ion implantation angle: 7°) in the semiconductor device of the embodiment.

In the semiconductor device of the embodiment, the dependency of the withstand voltage BV on the p vertical implantation width $L_1$ (α, β) and the ref concentration (a, b, c) in relation to the samples (A-1 to A-6) in which the concentration rate is changed by a fixed quantity in the multistage ion implantation (ion implantation angle: 7°) is as shown in FIG. 20. As for the respective parameters, the epilayer thickness $t_E$ is set at a constant 8 µm, the p vertical implantation widths $L_1$ are α and β, and the ref concentrations are a, b, and c, which correspond to the respective doses of $4 \times 10^{12}$ atoms/cm$^2$, $6 \times 10^{12}$ atoms/cm$^2$, and $8 \times 10^{12}$ atoms/cm$^2$ at an acceleration energy of 100 keV.

As shown in FIG. 20, in the vicinity of the p vertical implantation width β and ref concentration b in the A-2 sample, the withstand voltage BV peaks.

(Dependency of Withstand Voltage on p Vertical Implantation Width/Dose at Ion Implantation Angle of 0°)

The dependency of the withstand voltage BV on the design dimensions was studied in the semiconductor device of the embodiment. Here, the ion implantation angle was changed from 7° to 0°. The thickness of the n drift region 14 (epilayer thickness) was set to 8 μm with the resistivity of the n drift region 14 being 0.7 Ωcm. The p vertical implantation width $L_1$/n drift region width $L_2$ (Si mesa width) were set to 1.0 μm/3.0 μm and 0.8 μm/3.2 μm. The acceleration energies in the multistage ion implantation (ion implantation angle: 0°) to form the p vertical implantation regions $30_1$, $30_2$, $30_3$, and $30_4$ were set to 2 MeV, 1.1 MeV, 500 keV, and 100 keV. The diffusion drive temperature and time were respectively set to 1000° C. and 30 minutes.

Figure 21:
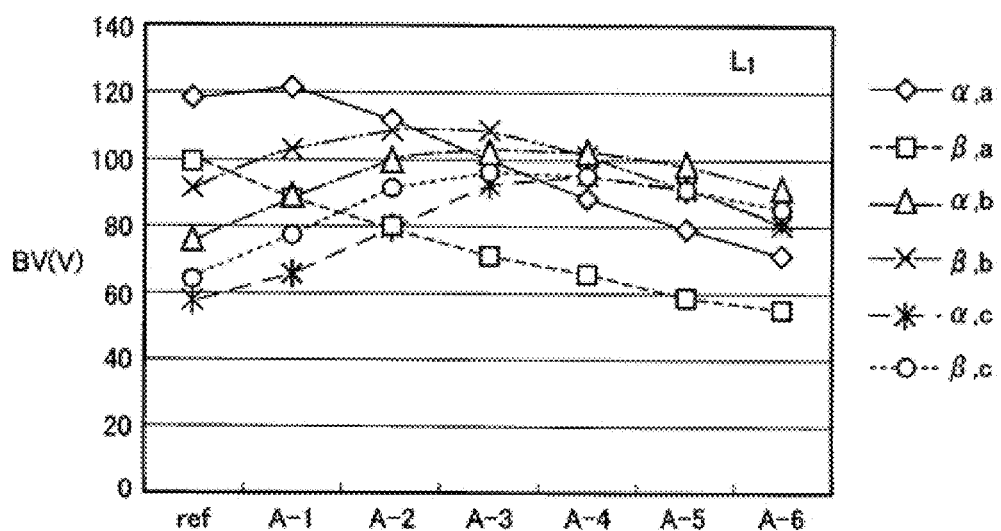
FIG. 21 shows dependencies of a withstand voltage BV on p vertical implantation width ($\alpha$, $\beta$) and ref concentrations (a, b, c) in relation to samples (A-1 to A-6) in which the concentration rate is changed by a fixed quantity in the multistage ion implantation (ion implantation angle: 0°) in the semiconductor device of the embodiment.

Dependencies of the withstand voltage BV on the p vertical implantation width $L_1$ (α, β) and ref concentrations (a, b, c) in relation to samples (A-1 to A-6) in which the concentration rate is changed by a fixed quantity during multistage ion implantation (ion implantation angle: 0°) in the semiconductor device of the embodiment are as shown in FIG. 21. As for the respective parameters, the epilayer thickness $t_E$ is set at a constant 8 μm, the p vertical implantation width $L_1$ is α and β, and the ref concentrations are a, b, and c, which correspond to the respective doses of $4 \times 10^{12}$ atoms/cm$^2$, $6 \times 10^{12}$ atoms/cm$^2$, and $8 \times 10^{12}$ atoms/cm$^2$ at an acceleration energy of 100 keV, for example.

As shown in FIG. 21, in the vicinity of the p vertical implantation width β and ref concentration b in the A-2 sample, the withstand voltage BV peaks, similar to what was shown in FIG. 20.

In the vicinity of the ref concentration a, a higher withstand voltage BV is attained, the reason of which is thought to be the concentration in the depth direction. When taking into consideration the margin of the process, it is preferable that the concentration grade be set such that the peak withstand voltage BV decreases but the margin increases. In other words, it is preferable that the p vertical implantation width β in the A-2 sample be set such that the peak withstand voltage BV is attained in the vicinity of the p vertical implantation width b.

(Withstand Voltage Trend due to Drive Temperature)

The dependency of the withstand voltage BV on the drive temperature was studied in the semiconductor device of the embodiment. Here, the ion implantation angle was changed from 7° to 0°. The thickness of the n drift region 14 (epilayer thickness) was set to 8 μm with the resistivity of the n drift region 14 being 0.7 Ωcm. The p vertical implantation width $L_1$/n drift region width $L_2$ (Si mesa width) were set to 1.0 μm/3.0 μm and 0.8 μm/3.2 μm. The acceleration energies in the multistage ion implantation (ion implantation angle: 0°) to form the p vertical implantation regions $30_1$, $30_2$, $30_3$, and $30_4$ were set to 2 MeV, 1.1 MeV, 500 keV, and 100 keV. The diffusion drive temperatures were set to 1050° C., 1100° C., and 1150° C. and the drive time was set to 30 minutes.

Figure 22:
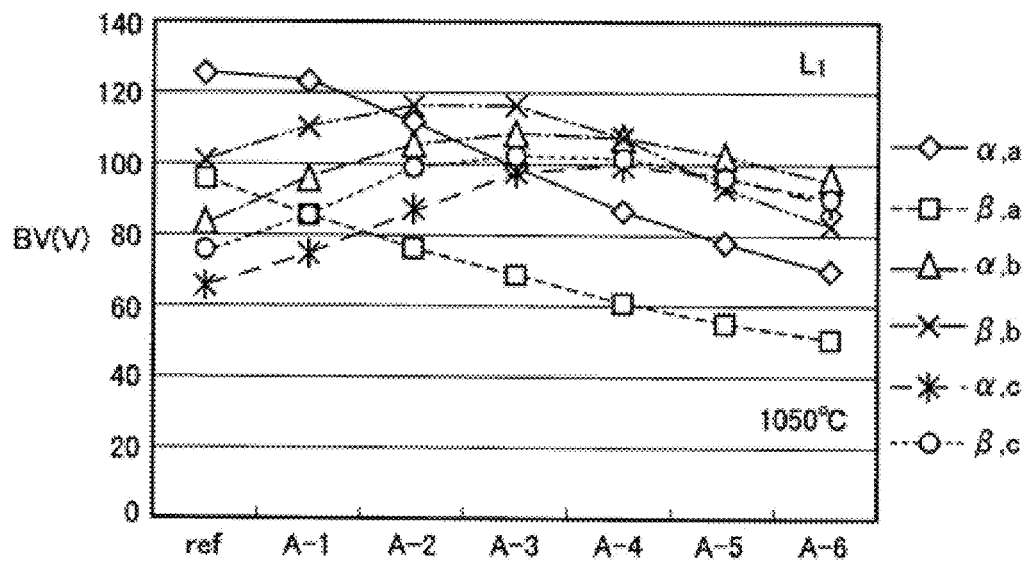
FIG. 22 shows dependencies of a withstand voltage BV on p vertical implantation width ($\alpha$, $\beta$) and ref concentrations (a, b, c) in relation to samples (A-1 to A-6) in which the concentration rate is changed by a fixed quantity in the multistage ion implantation (ion implantation angle: 0°, drive temperature: 1050° C.) in the semiconductor device of the embodiment.

In the semiconductor device of the embodiment, the dependency of the withstand voltage BV on the p vertical implantation width $L_1$ (α, β) and ref concentration (a, b, c) in relation to the samples (A-1 to A-6) in which the concentration rate is changed by a fixed quantity during multistage ion implantation (ion implantation angle: 0°; drive temperature: 1050° C.) is as shown in FIG. 22. As for the respective parameters, the epilayer thickness $t_E$ is set at a constant 8 μm, the p vertical implantation width $L_1$ is α and β, and the ref concentrations are a, b, and c, which correspond to the respective doses of $4 \times 10^{12}$ atoms/cm$^2$, $6 \times 10^{12}$ atoms/cm$^2$, and $8 \times 10^{12}$ atoms/cm$^2$ at an acceleration energy of 100 keV, for example.

Figure 23:
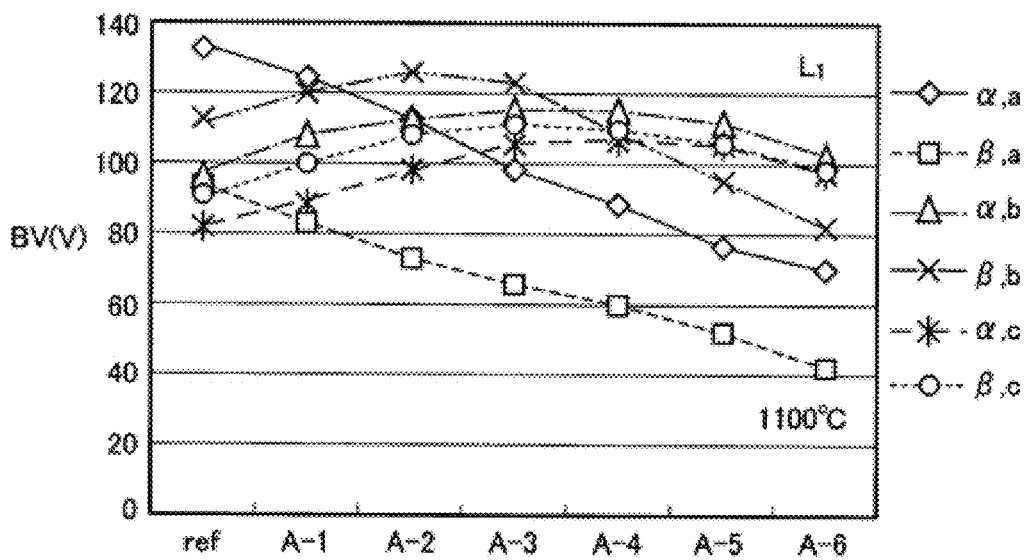
FIG. 23 shows dependencies of a withstand voltage BV on a p vertical implantation width ($\alpha$, $\beta$) and ref concentrations (a, b, c) in relation to samples (A-1 to A-6) in which the concentration rate is changed by a fixed quantity in the multistage ion implantation (ion implantation angle: 0°, drive temperature: 1100° C.) in the semiconductor device of the embodiment.

In the semiconductor device of the embodiment, the dependency of the withstand voltage BV on the p vertical implantation width $L_1$ (α, β) and ref concentration (a, b, c) in relation to the samples (A-1 to A-6) in which the concentration rates are changed by a fixed quantity during multistage ion implantation (ion implantation angle: 0°; drive temperature: 1100° C.) is as shown in FIG. 23. As for the respective parameters, the epilayer thickness $t_E$ is set at a constant 8 μm, the p vertical implantation width $L_1$ is 1.0 μm and 0.8 μm, and the ref concentrations are a, b, and c, which correspond to the respective doses of $4 \times 10^{12}$ atoms/cm$^2$, $6 \times 10^{12}$ atoms/cm$^2$, and $8 \times 10^{12}$ atoms/cm$^2$ at an acceleration energy of 100 keV.

Figure 24:
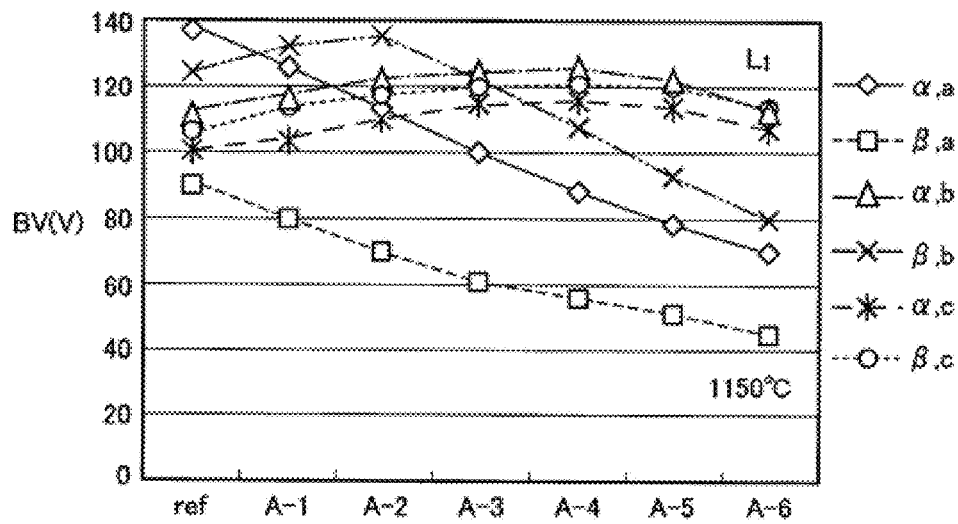
FIG. 24 shows dependencies of a withstand voltage BV on a p vertical implantation width ($\alpha$, $\beta$) and ref concentrations (a, b, c) in relation to samples (A-1 to A-6) in which the concentration rate is changed by a fixed quantity in the multistage ion implantation (ion implantation angle: 0°, drive temperature: 1150° C.) in the semiconductor device of the embodiment.

In the semiconductor device of the embodiment, the dependency of the withstand voltage BV on the p vertical implantation width $L_1$ (α, β) and ref concentration (a, b, c) in relation to the samples (A-1 to A-6) in which the concentration rates are changed by a fixed quantity during multistage ion implantation (ion implantation angle: 0°; drive temperature: 1150° C.) is as shown in FIG. 24. As for the respective parameters, the epilayer thickness $t_E$ is set at a constant 8 μm, the p vertical implantation widths $L_1$ (α, β) are 1.0 μm and 0.8 μm, respectively, and the ref concentrations are a, b, and c, which correspond to the respective doses of $4 \times 10^{12}$ atoms/cm$^2$, $6 \times 10^{12}$ atoms/cm$^2$, and $8 \times 10^{12}$ atoms/cm$^2$ at an acceleration energy of 100 keV, for example.

As shown in FIGS. 22 to 24, as the drive temperature rises, the withstand voltage BV tends to rise. The peak withstand voltage BV does not change greatly. However, because this trend occurs due to the expansion of diffusion, this also leads to a decreased current path size in the n drift region 14, and thus, a rise in drive temperature is not necessarily desirable.

In the vicinity of the p vertical implantation width β and ref concentration b in the A-2 sample, the withstand voltage BV peaks, similar to what was shown in FIGS. 20 and 21.

In the vicinity of the ref concentration a, a higher withstand voltage BV is attained, the reason of which is thought to be the concentration in the depth direction. When taking into consideration the margin of the process, it is preferable that the concentration grade be set such that the peak withstand voltage BV decreases but the margin increases. In other words, it is preferable that the p vertical implantation width $L_1$ in the A-2 sample be set to β such that the peak withstand voltage BV is attained in the vicinity of the p vertical implantation width b.

(Current/Voltage Characteristics)

The dependency of the current/voltage characteristics on the drive temperature was studied in the semiconductor device of the embodiment. Here, the ion implantation angle was set to 7°. The thickness of the n drift region 14 (epilayer thickness) was set to 8 μm with the resistivity of the n drift region 14 being 0.7 Ωcm. The p vertical implantation width $L_1$/n drift region width $L_2$ (Si mesa width) were set to 1.0 μm/3.0 μm and 0.8 μm/3.2 μm. The acceleration energies in the multistage ion implantation (ion implantation angle: 7°) to form the p vertical implantation regions $30_1$, $30_2$, $30_3$, and $30_4$ were set to 2 MeV, 1.1 MeV, 500 keV, and 100 keV. Also, the ref concentrations a, b, and c correspond to the respective doses of $4 \times 10^{12}$ atoms/cm$^2$, $6 \times 10^{12}$ atoms/cm$^2$, and $8 \times 10^{12}$ atoms/cm² at an acceleration energy of 100 keV, for example. The diffusion drive temperatures were set to 1050° C., 1100° C., and 1150° C. and the drive time was set to 30 minutes.

Figure 25:
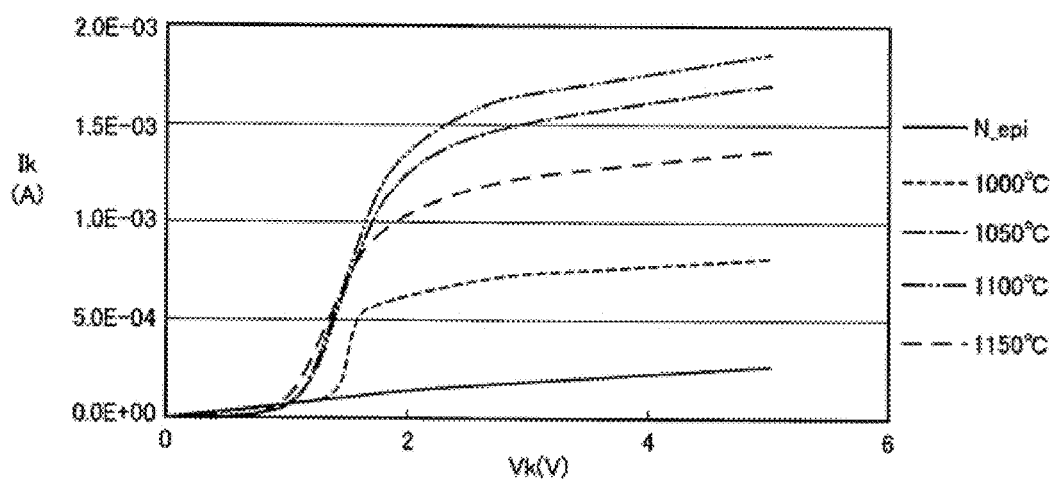
FIG. 25 shows an example of current/voltage characteristics in a high current region with the drive temperature of the A-2 sample (p vertical implantation width $\beta$; ref concentration b) as a parameter, in the semiconductor device of the embodiment.
Figure 26:
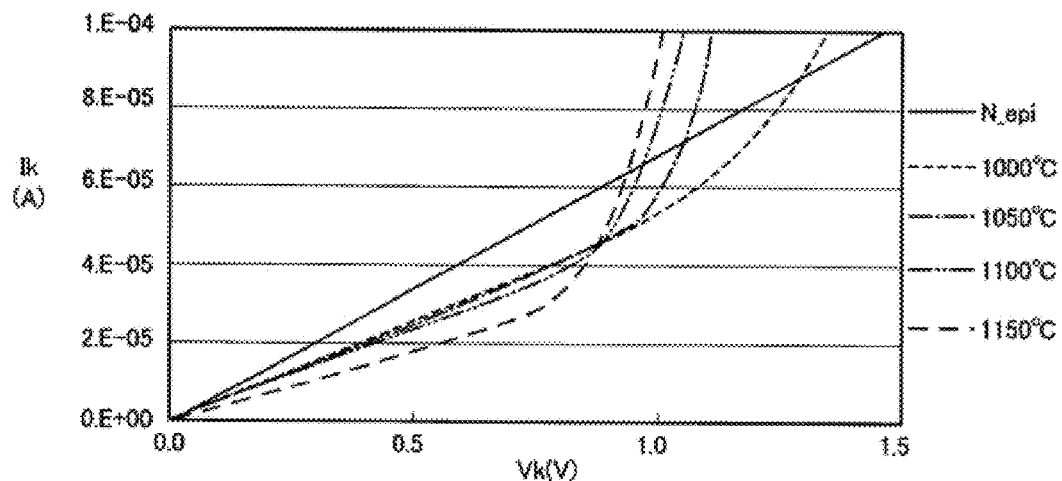
FIG. 26 shows an example of current/voltage characteristics in a low current region with the drive temperature of the A-2 sample (p vertical implantation width $\beta$; ref concentration b) as a parameter, in the semiconductor device of the embodiment.

In the semiconductor device of the embodiment, an example of current/voltage characteristics in a high current region with the drive temperature of the A-2 sample (p vertical implantation width 0.8 µm; dose 6.0×10¹² atoms/cm²) as a parameter is shown in FIG. 25, and an example of the current/voltage characteristics in the low current region is shown in FIG. 26. The drive temperature is changed as follows: 1000° C., 1050° C., 1100° C., and 1150° C.

As shown in FIG. 25, in the high current region, a tendency for the ampacity to decrease at a peak of 1050° C. to 1100° C. is observed. Also, as shown in FIG. 26, in the low current region, a pronounced increase in drift resistance at a drive temperature of 1150° C. is observed. Thus, when considering the manufacturing margin, a drive temperature of approximately 1050° C. is a desirable diffusion condition.

(FLR Design)

A design of the area outside the semiconductor device of the embodiment has been studied. Here, the ion implantation angle was set to 7°. The thickness of the n drift region 14 (epilayer thickness) was set to 8 µm with the resistivity of the n drift region 14 being 0.7 Ωcm. The p vertical implantation width $L_1$/n drift region width $L_2$ (Si mesa width) was set to 0.8 µm/3.2 µm. The acceleration energies in the multistage ion implantation (ion implantation angle: 7°) to form the p vertical implantation regions $30_1$, $30_2$, $30_3$, and $30_4$ were set to 2 MeV, 1.1 MeV, 500 keV, and 100 keV. The diffusion drive temperature was set to 1050° C. and the drive time was set to 30 minutes.

Figure 27:
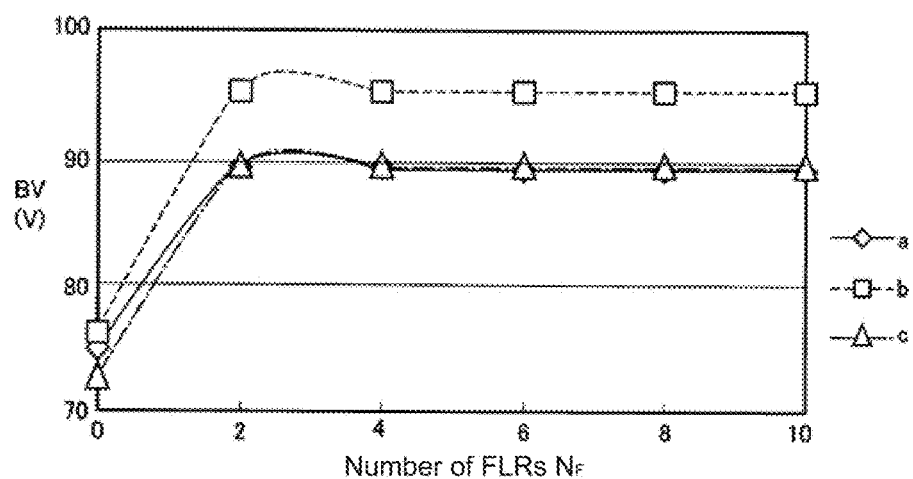
FIG. 27 shows a relation between the withstand voltage BV having the ref concentration (a, b, c) of the A-2 sample (p vertical implantation width $\beta$; drive temperature: 1050° C.) as a parameter, and the number $N_F$ of field limiting rings (FLR), in the semiconductor device of the embodiment.

In the semiconductor device of the embodiment, the relation between the withstand voltage BV and the number of FLRs $N_F$ with the dose of the A-2 sample (p vertical implantation width=0.8 µm; drive temperature: 1050° C.) as a parameter is as shown in FIG. 27.

The ref concentrations a, b, and c correspond to the respective doses of 4×10¹² atoms/cm², 6×10¹² atoms/cm², and 8×10¹² atoms/cm² at an acceleration energy of 100 keV, with the respective parameters being as follows: the epilayer thickness $t_E$ is set at 8 µm, the p vertical implantation width β is 0.8 µm, for example, and the drive temperature is 1050° C.

As shown in FIG. 27, the same withstand voltage BV can be obtained with the number of FLRs $N_F$ being set at two or greater. However, the withstand voltage BV is set at 90V to 100V, which is lower than the peak withstand voltage BV of approximately 120V to 130V attained as shown in FIGS. 15 and 16.

As a result, it can be understood that the FLR needs to be redesigned. The withstand voltage determination point is the distance between the p-type diffusion connected to the anode from the impact ion susceptibility distribution, and the floating diffusion (FLR, which is not in contact with electrodes and aims to reduce the electric field) outside of the p-type diffusion. By decreasing the distance, it is possible to improve the peak withstand voltage BV.

(Physical Quantity Distribution just under Withstand Voltage)

Figure 28A:
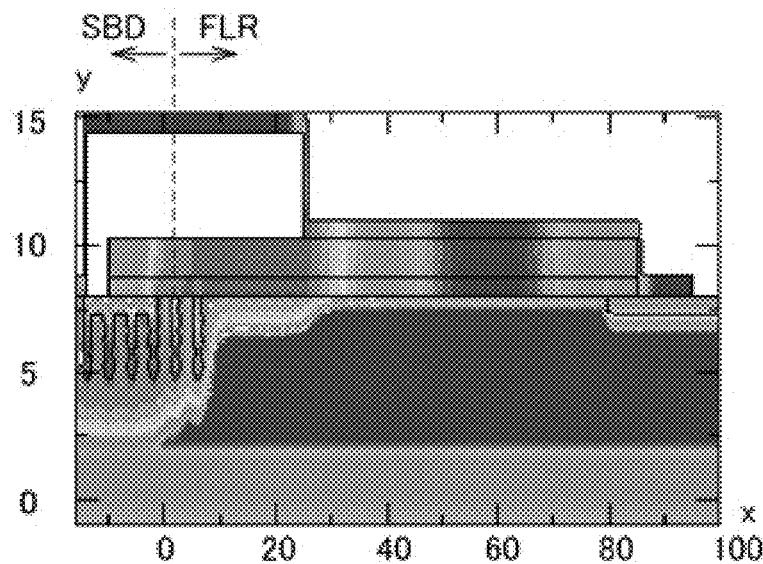
FIG. 28A shows simulation results for an electric field distribution when a voltage just under the withstand voltage (91V) is applied in an A-2 sample (p vertical implantation width=$\beta$; 100 KeV; dose=$6.0\times10^{12}$ atoms/cm$^2$; drive temperature: 1050° C.) with the FLR number $N_F$ being 2 in the semiconductor device of the embodiment.
Figure 28B:
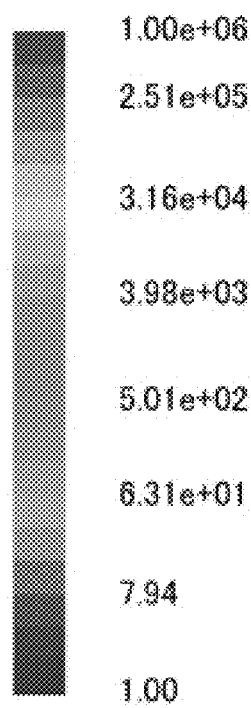
FIG. 28B shows a numerical example of an electric field distribution.

In the semiconductor device of the embodiment, the simulation result of the electric field distribution when a voltage just under the withstand voltage is applied (91V) for an A-2 sample (p vertical implantation width: 0.8 µm; dose=6×10¹² atoms/cm²; drive temperature: 1050° C.) in which the number of FLRs NF is two is as shown in FIG. 28A, and a numerical example of the electric field distribution is as shown in FIG. 28B.

Figure 29A:
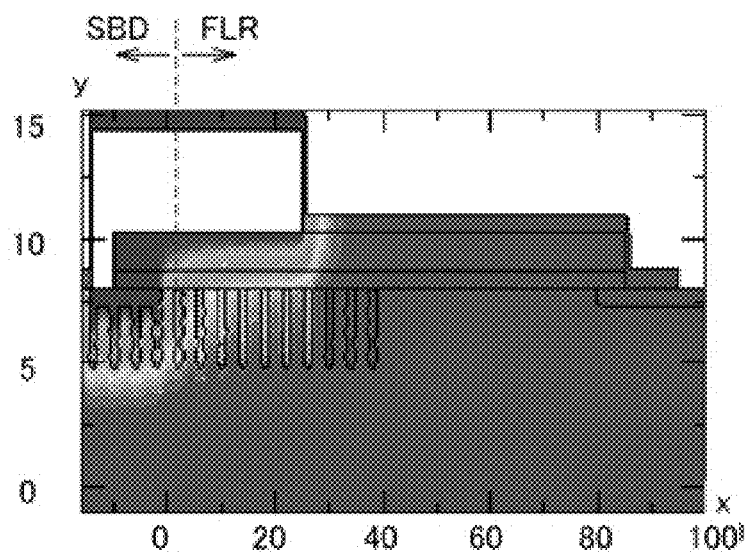
FIG. 29A shows simulation results for an electric potential distribution when a voltage just under the withstand voltage (91V) is applied in an A-2 sample (p vertical implantation width=$\beta$; 100 KeV; dose=$6.0\times10^{12}$ atoms/cm$^2$; drive temperature: 1050° C.) with the FLR number $N_F$ being 10 in the semiconductor device of the embodiment.
Figure 29B:
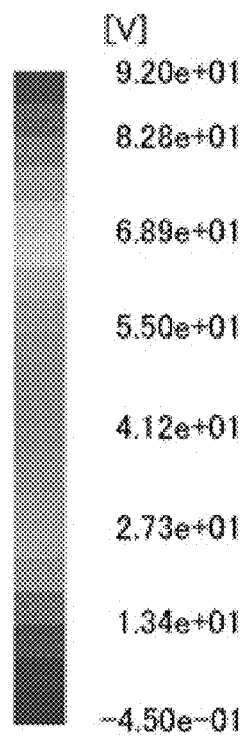
FIG. 29B shows a numerical example of an electric potential distribution.

In the semiconductor device of the embodiment, the simulation result of the electric potential distribution when a voltage just under the withstand voltage is applied (91V) for an A-2 sample (p vertical implantation width: 0.8 µm; dose=6×10¹² atoms/cm²; drive temperature: 1050° C.) in which the number of FLRs NF is ten is as shown in FIG. 29A, and a numerical example of the electric potential distribution is as shown in FIG. 29B.

Figure 30A:
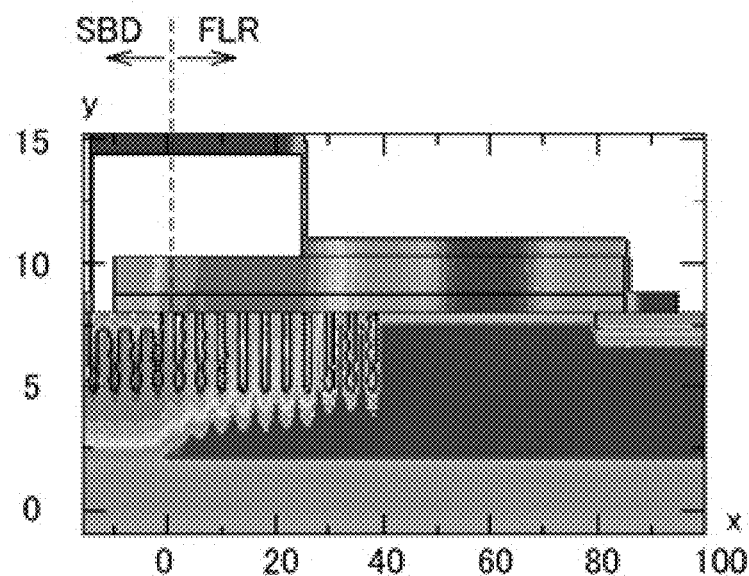
FIG. 30A shows simulation results for an electric field distribution when a voltage just under the withstand voltage (91V) is applied in an A-2 sample (p vertical implantation width=$\beta$; 100 KeV; dose=$6.0\times10^{12}$ atoms/cm$^2$; drive temperature: 1050° C.) with the FLR number $N_F$ being 10 in the semiconductor device of the embodiment.
Figure 30B:
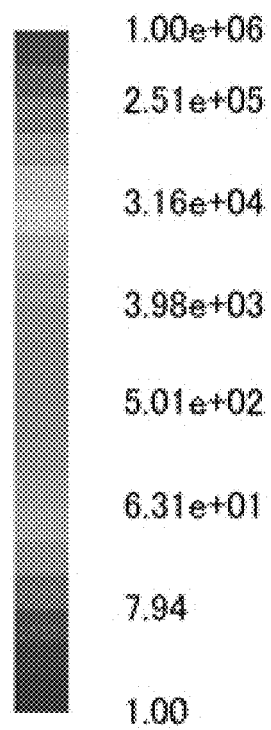
FIG. 30B shows a numerical example of an electric field distribution.

The simulation results of the electrical field distribution under the same conditions is as shown in FIG. 30A, and a numerical example of the electric field distribution is as shown in FIG. 30B.

(Withstand Voltage and Number of FLRs)

In the semiconductor device of the embodiment, improvement in withstand voltage by dimensional design of the FLR was studied. Here, the ion implantation angle was set to 7°. The thickness of the n drift region 14 (epilayer thickness) was set to 8 µm with the resistivity of the n drift region 14 being 0.7 Ωcm. The p vertical implantation width $L_1$/n drift region width $L_2$ (Si mesa width) was set to 0.8 µm/3.2 µm. The acceleration energies in the multistage ion implantation (ion implantation angle: 7°) to form the p vertical implantation regions $30_1$, $30_2$, $30_3$, and $30_4$ were set to 2 MeV, 1.1 MeV, 500 keV, and 100 keV. The doses at 100 keV were set to 4.0×10¹² atoms/cm², 6.0×10¹² atoms/cm², and 8.0×10¹² atoms/cm². The diffusion drive temperature was set to 1050° C. and the drive time was set to 30 minutes.

Figure 31:
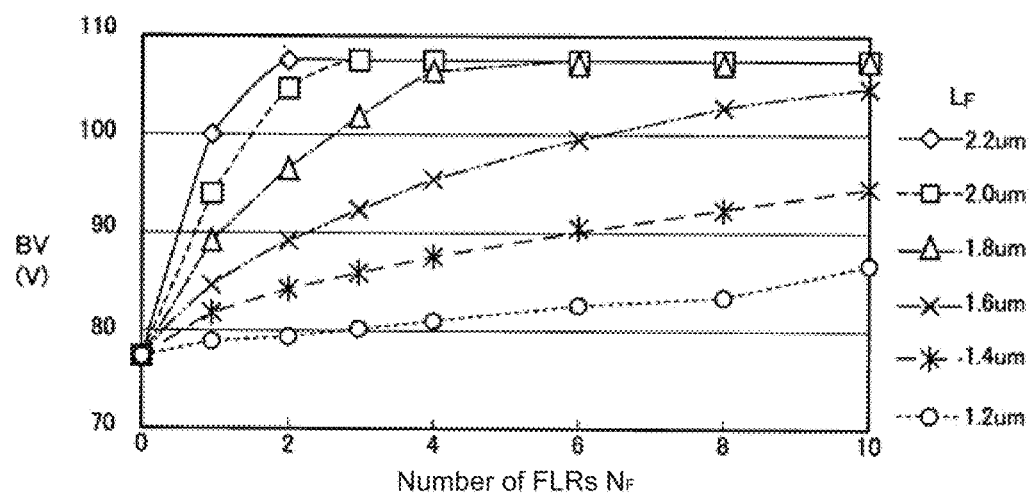
FIG. 31 shows a relation between the withstand voltage BV having the gap $L_F$ of the FLRs in the A-2 sample (p vertical implantation=$\beta$; drive temperature: 1050° C.) as a parameter, and the number $N_F$ of FLRs, in the semiconductor device of the embodiment.

In the semiconductor device of the embodiment, the relation between the withstand voltage BV and the number of FLRs $N_F$ with the gap $L_F$ between the FLRs in the A-2 sample (p vertical implantation width=0.8 µm; drive temperature: 1050° C.) as a parameter is as shown in FIG. 31.

Figure 32:
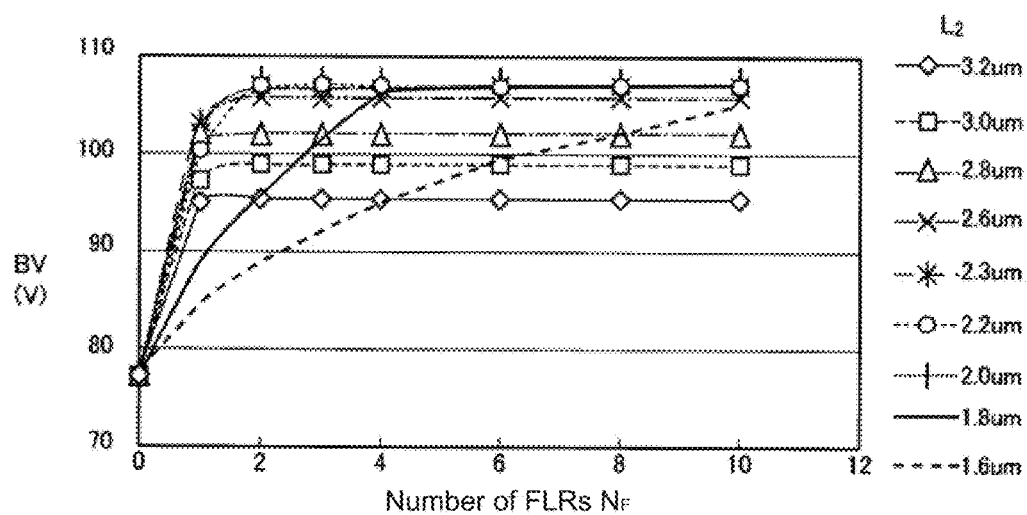
FIG. 32 shows a relation between the withstand voltage BV having the Si mesa width $L_2$ in the A-2 sample (p vertical implantation=$\beta$; drive temperature: 1050° C.) as a parameter, and the number $N_F$ of FLRs, in the semiconductor device of the embodiment.

Also, in the semiconductor device of the embodiment, the relation between the withstand voltage BV and the number of FLRs $N_F$ with the Si mesa width $L_2$ in the A-2 sample (p vertical implantation width=0.8 µm; drive temperature: 1050° C.) as a parameter is as shown in FIG. 32.

In FIGS. 31 and 32, the Si mesa width $L_2$ is set equal to the FLR gap $L_F$.

As shown in FIGS. 31 and 32, when the FLR gap $L_F$ (Si mesa width $L_2$) is 2.3 µm to 2.6 µm the withstand voltage BV tends to be stable. However, a decrease of a few volts from the withstand voltage in a cell of the semiconductor device 1 of the embodiment can be seen. This decrease in voltage results from the usage of a floating FLR.

(Physical Quantity Distribution Just Under Withstand Voltage)

Figure 33A:
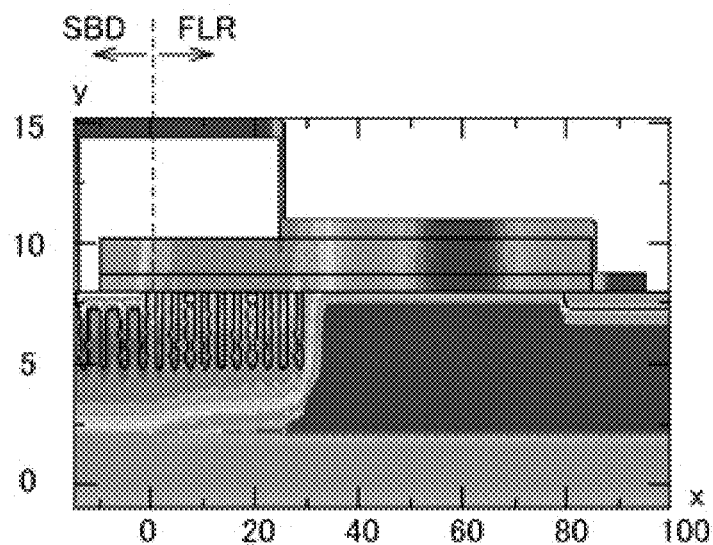
FIG. 33A shows simulation results of an electric field distribution when a voltage just under the withstand voltage is applied (101V) in the A-2 sample (p vertical implantation width=$\beta$; 100 keV; dose=$6.0\times10^{12}$ atoms/cm$^2$; FLR number $N_F$=10; drive temperature: 1050° C.) with the Si mesa width $L_2$ and the FLR gap $L_F$ being 2.2 µm, in the semiconductor device of the embodiment.
Figure 33B:
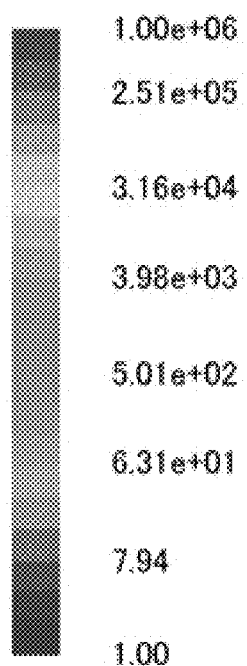
FIG. 33B shows a numerical example of the electric field distribution.

In the semiconductor device of the embodiment, the simulation results of the electric field distribution when a voltage just under the withstand voltage is applied (101V) in the A-2 sample (p vertical implantation width=0.8 µm; 100 keV; dose=b atoms/cm²; number of FLRs $N_F$=10; drive temperature: 1050° C.) with the Si mesa width $L_2$/FLR gap $L_F$=2.2 µm are as shown in FIG. 33A, and a numerical example of the electric field distribution is as shown in FIG. 33B.

Figure 34A:
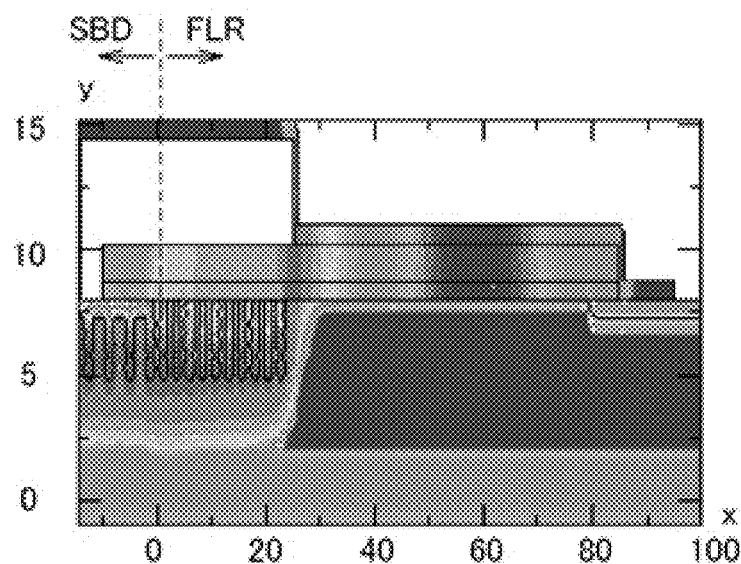
FIG. 34A shows simulation results of an electric field distribution when a voltage just under the withstand voltage is applied (101V) in the A-2 sample (p vertical implantation width=$\beta$; 100 keV; dose=$6.0\times10^{12}$ atoms/cm$^2$; FLR number $N_F$=10; drive temperature: 1050° C.) with the Si mesa width $L_2$ and the FLR gap $L_F$ being 1.6 µm, in the semiconductor device of the embodiment.
Figure 34B:
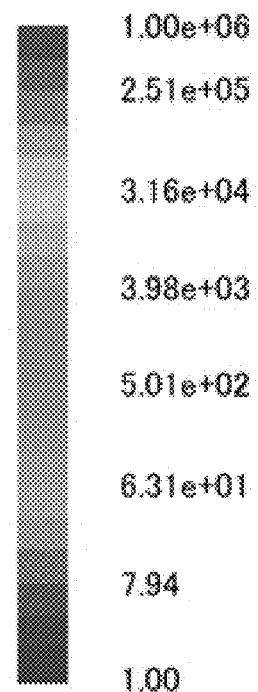
FIG. 34B shows a numerical example of the electric field distribution.

In the semiconductor device of the embodiment, the simulation results of the electric field distribution when a voltage just under the withstand voltage is applied (101V) in the A-2 sample (p vertical implantation width=0.8 µm; 100 keV; dose=6×10¹² atoms/cm²; number of FLRs $N_F$=10; drive temperature: 1050° C.) with the Si mesa width $L_2$/FLR gap $L_F$=1.6 µm are as shown in FIG. 34A, and a numerical example of the electric field distribution is as shown in FIG. 34B.

(Schematic Cross-Sectional Structure of Vicinity of FLR)

Figure 35:
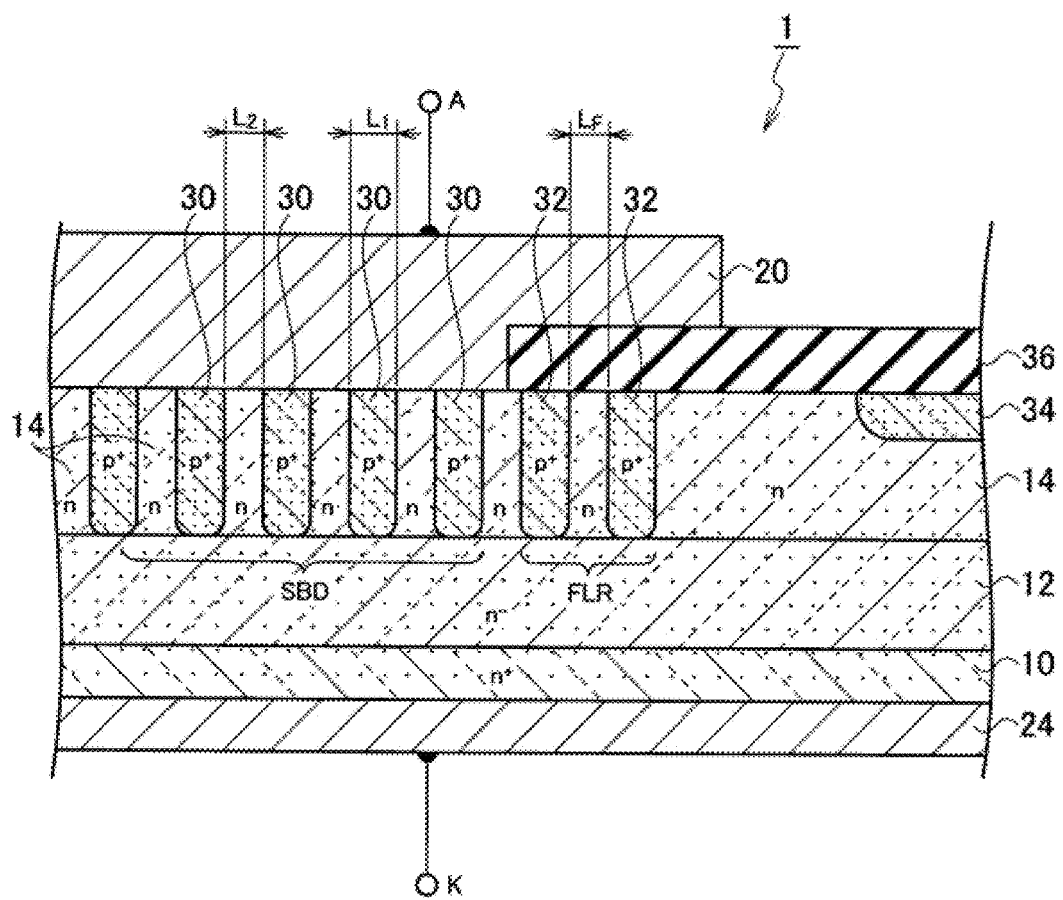
FIG. 35 is a schematic cross-sectional view in the vicinity of the FLRs when the FLR number $N_F$=2, in the semiconductor device of the embodiment.
Figure 36:
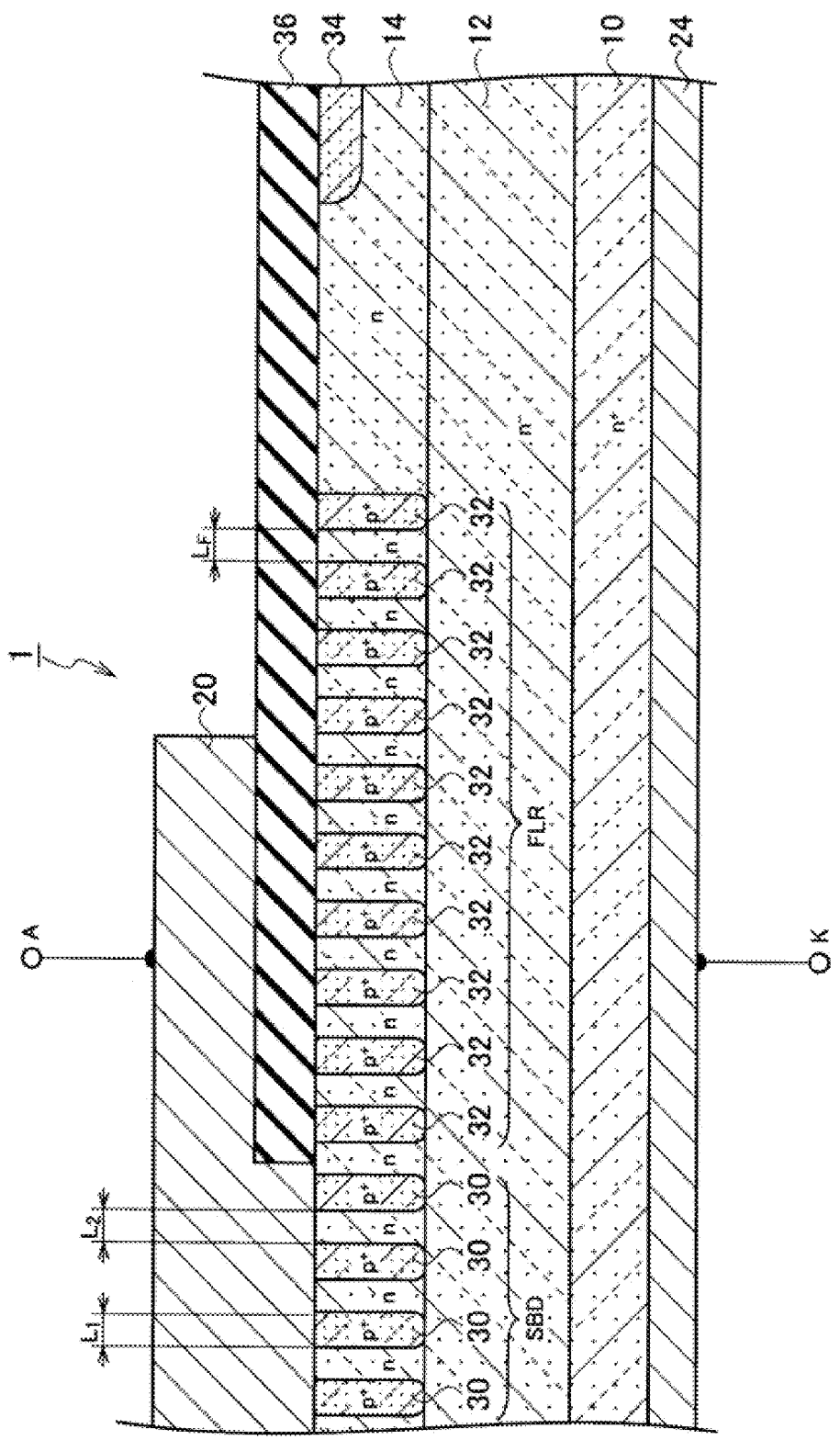
FIG. 36 is a schematic cross-sectional view in the vicinity of the FLRs when the FLR number $N_F$=10, in the semiconductor device of the embodiment.

In the semiconductor device 1 of the embodiment, the schematic cross-sectional structure of the vicinity of the FLR when the number of FLRs $N_F$ is two is as shown in FIG. 35, and the schematic cross-sectional structure of the vicinity of the FLR when the number of FLRs $N_F$ is ten is as shown in FIG. 36.

In the semiconductor device 1 of the embodiment, the n drift region width $L_2$ (Si mesa width) of the SBD portion may be different from the FLR gap $L_F$ in the FLR portion. Alternatively, the n drift region width $L_2$ (Si mesa width) of the SBD portion may be equal to the gap $L_F$ between the FLRs in the FLR portion.

As shown in FIGS. 35 and 36, the semiconductor device 1 of the embodiment includes: the first conductive type semiconductor substrate 10; a first conductive type drift region 14 formed by epitaxial growth on the semiconductor substrate 10; the plurality of second conductive type vertical implantation regions 30 formed in the drift region 14 by multistage ion implantation, the first conductive vertical implantation regions 30 having the prescribed vertical implantation width $L_1$ and the prescribed drift region width $L_2$; the plurality of first conductive type FLR regions 32 having the prescribed gap $L_F$ between the FLRs, the first conductive type FLR regions being formed by multistage ion implantation; the insulating layer 36 disposed on the FLR regions 32, the drift region 14, and the diffusion region 34; the anode electrode 20 disposed on the front surface of the drift region 14 opposite to the semiconductor substrate 10, the anode electrode 20 being in Schottky contact with the drift region 14 and in ohmic contact with the second conductive-type vertical implantation regions 30; and the cathode electrode 24 disposed on the rear side of the semiconductor substrate 10 opposite to the drift region 14, the cathode electrode 24 being in ohmic contact with the semiconductor substrate 10.

As shown in FIGS. 35 and 36, the anode electrode 20 is connected to the anode terminal A and the cathode electrode 24 is connected to the cathode terminal K.

As shown in FIGS. 2A and 2B, the vertical implantation regions 30 may be formed in a stripe pattern in the drift region 14, and as shown in FIGS. 3A and 3B, the vertical implantation regions 30 may be formed in a circular dot pattern.

The FLR regions 32, as shown in FIG. 11A are disposed so as to surround the periphery of the SBD portion.

As shown in FIGS. 35 to 36, the vertical implantation regions 30 are formed in the drift region 14 so as to have a prescribed vertical implantation width $L_1$ and a prescribed drift region width $L_2$.

As shown in FIGS. 35 to 36, the FLR regions 32 are formed in the drift region 14 so as to have prescribed FLR gaps $L_F$ therebetween. The diffusion width of the FLR regions 32 may be set equal to the vertical implantation width $L_1$ of the vertical implantation regions 30.

Also, as shown in FIGS. 35 to 36, the semiconductor device 1 of the embodiment may include a first conductive type high resistance layer 12 formed by epitaxial growth on the semiconductor substrate 10, with the drift region 14 being disposed on the high resistance layer 12. The first conductive type high resistance layer 12 is not necessarily required. As shown in FIGS. 35 to 36, the semiconductor device 1 of the embodiment can be made so as to have a relatively high withstand voltage by providing the high resistance layer 12.

In the semiconductor device 1 of the embodiment, the multistage ion implantation to the FLR regions 32 includes two or more steps.

Figure 37:
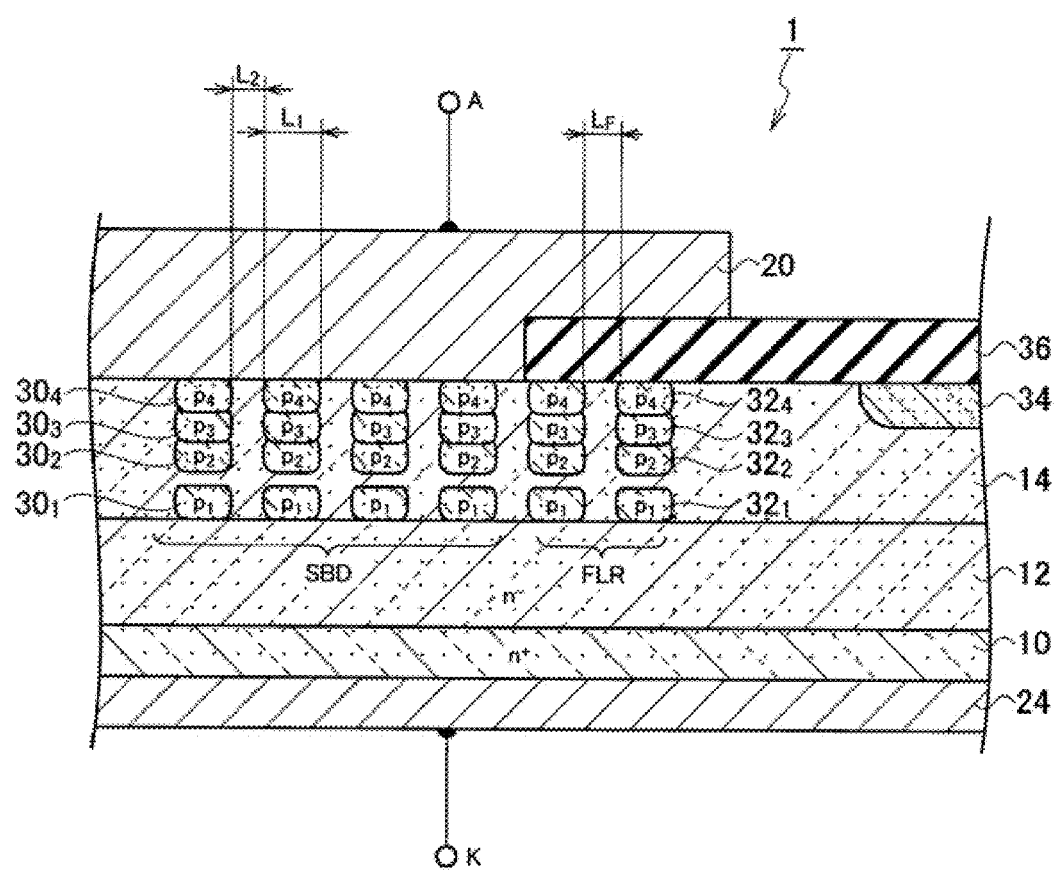
FIG. 37 is a schematic cross-sectional view in the vicinity of the FLRs when the FLR number $N_F$=2, in the semiconductor device of the embodiment formed by four step ion implantation.
Figure 38:
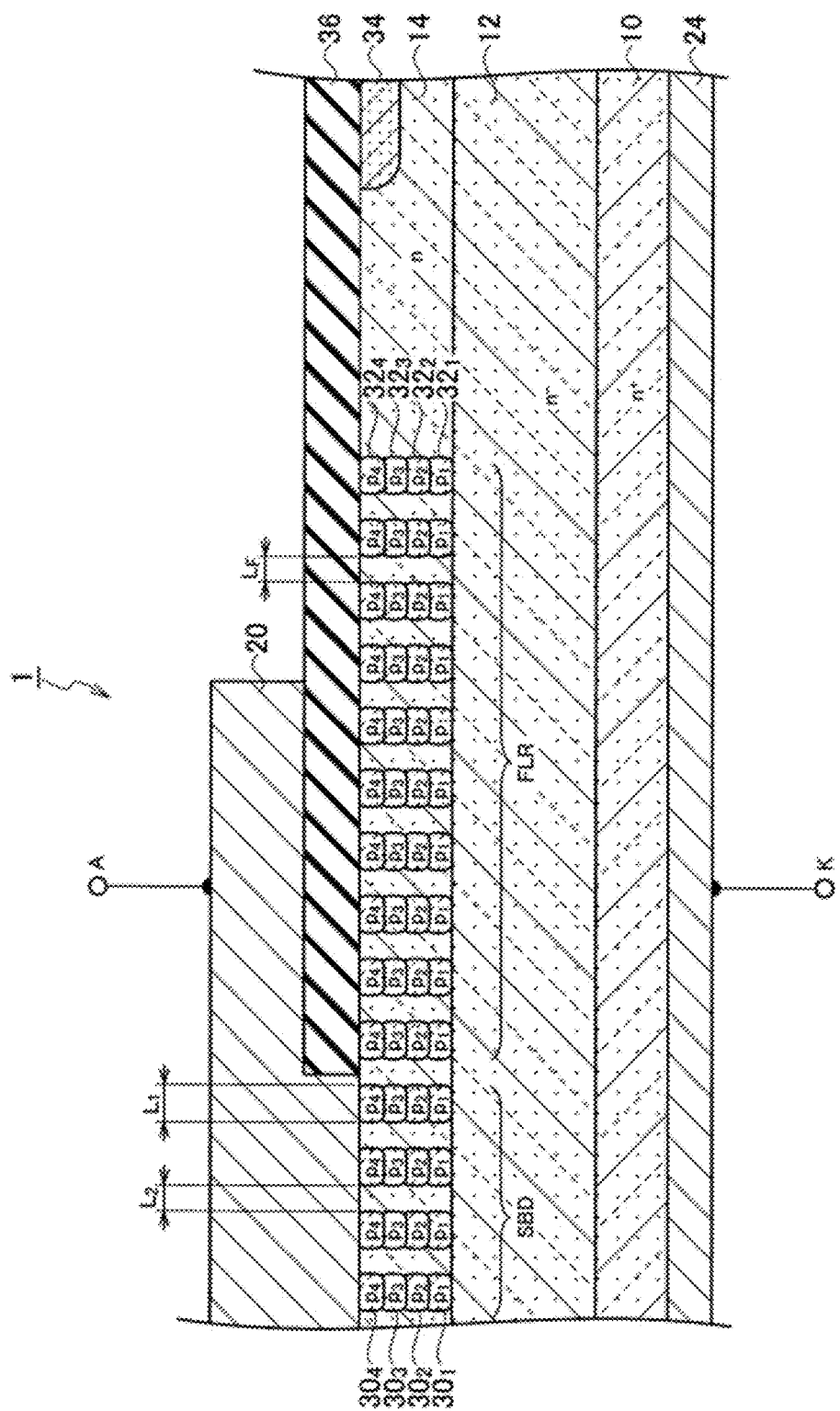
FIG. 38 is a schematic cross-sectional view in the vicinity of the FLRs when the FLR number $N_F=10$, in the semiconductor device of the embodiment formed by four step ion implantation.

In the semiconductor device 1 of the embodiment formed by four stage ion implantation, the schematic cross-sectional view of the vicinity of the FLRs when the number of FLRs $N_F=2$ is as shown in FIG. 37, and the cross-sectional view of the vicinity of the FLRs when the number of FLRs $N_F=10$ is as shown in FIG. 38.

In the semiconductor device 1 of the embodiment, the multistage ion implantation to the FLR regions $32_1$, $32_2$, $32_3$, and $32_4$ may include four steps, and the acceleration energies may be 2 MeV, 1.1 MeV, 500 keV, and 100 keV.

Also, in the semiconductor device 1 of the embodiment, the dose when the acceleration energy is 100 keV during multistage ion implantation of the FLR regions $32_1$, $32_2$, $32_3$, and $32_4$ may be approximately $4 \times 10^{12}$ atoms/cm$^2$ to approximately $8 \times 10^{12}$ atoms/cm$^2$, for example. Here, the impurity ion can be boron (B), for example.

In the semiconductor device 1 of the embodiment, in the multistage ion implantation of the FLR regions $32_1$, $32_2$, $32_3$, and $32_4$, the dose when the acceleration energy is 500 keV, 1.1 MeV, and 2 MeV may respectively have a concentration rate of approximately 5% to 30% less by a fixed quantity compared to the dose for when the acceleration energy is 100 keV.

In the semiconductor device 1 of the embodiment, in the multistage ion implantation of the FLR regions $32_1$, $32_2$, $32_3$, and $32_4$, the dose when the acceleration energy is 500 keV, 1.1 MeV, and 2 MeV may respectively have a concentration rate of approximately 5% to 30% less at a fixed rate, for example, compared to the dose for when the acceleration energy is 100 keV.

In the semiconductor device 1 of the embodiment, the diffusion width of the FLR regions 32 may be approximately 0.8 μm to approximately 1.0 μm, for example.

In the semiconductor device 1 of the embodiment, the FLR gap $L_F$ may be approximately 1.6 μm to approximately 3.2 μm, for example. It is preferable that the gap LF be approximately 2.3 μm to 2.6 μm, for example.

The basic structure of the semiconductor device 1 of the embodiment has an active SBD region and FLR regions that surround the periphery thereof, and the structure is simple with a small number of layers, with a simple manufacturing method, and thus, the manufacturing cost can be reduced.

Compared to a device with a relatively low-class withstand voltage (approximately 60V or less, for example), the chip size becomes larger depending on the relative resistance and thickness of the material in a device with a mid-class withstand voltage (approximately 60V to approximately 200V, for example), and the main use for mid-class withstand voltage devices is power systems, and thus, it is possible to improve performance by reducing series resistance using a high concentration epitaxial growth layer while achieving high withstand voltage with an SJ structure.

In other words, in the semiconductor device 1 of the embodiment, the resistivity and thickness of the epitaxial growth layer of the n drift region 14 are optimized by the SJ structure, thus attaining a mid-class withstand voltage SBD (approximately 60V to approximately 200V, for example).

In the semiconductor device 1 of the embodiment, the structure of the FLR regions is optimized and the area of the SBD region in relation to the chip size is increased, and thus, the area efficiency can be increased.

In the semiconductor device 1 of the embodiment, in order to improve the withstand voltage by use of the high concentration epitaxial growth material, the FLR regions can be made by the trench field plate technique. In other words, as shown in FIGS. 36 to 38, a structure in which the electric field is reduced is formed by forming the FLR regions 32 ($32_1$, $32_2$, $32_3$, and $32_4$) by the SJ structure, and extending an anode electrode 20 over the FLR regions 32 ($32_1$, $32_2$, $32_3$, and $32_4$) across the insulating layer 36.

In the semiconductor device 1 of the embodiment, the use of the SJ structure in the SBD region allows for the junction FET effect in the p vertical implantation regions 30, and thus, it is possible to mitigate reverse leakage current in the SBD.

As a result, in the embodiment, an SBD with an improved performance and low cost SJ structure at a mid-class withstand voltage is attained.

In the semiconductor device 1 of the embodiment, in order to improve withstand voltage while using the high concentration epitaxial growth material, the SJ structure including the p vertical implantation regions 30 ($30_1$, $30_2$, $30_3$, $30_4$) formed by multistage ion implantation and the n drift region 14 is used.

In the semiconductor device 1 of the embodiment, it is possible to mitigate leakage current by using the SJ structure while simultaneously attaining a low forward voltage $V_F$. Thus, in the semiconductor device 1 of the embodiment, it is possible to attain a mid-class withstand voltage, a low forward voltage VF, and low leakage current.

Furthermore, in the semiconductor device 1 of the embodiment, it is possible to attain low ON voltage by the conductive modulation effect by the junction of the p vertical implantation region (30), the n drift region (14), and the $n^+$ substrate (10) in the high current region, due to forward voltage characteristics.

In the semiconductor device 1 of the embodiment, the following process conditions and dimensions are used as attainable conditions for mid-class withstand voltage devices (60V to 100V).

The thickness of the n drift region 14 (thickness of epitaxial growth layer) was set at 7 μm, 8 μm, and 9 μm, with the resistivity of the n drift region 14 being 0.7 Ωcm. The p vertical implantation width $L_1$/n drift region width $L_2$ (Si mesa width) were set to 1.0 μm/3.0 μm and 0.8 μm/3.2 μm. The acceleration energies in the multistage ion implantation (ion implantation angle: 7°) to form the p vertical implantation regions $30_1$, $30_2$, $30_3$, and $30_4$ were set to 2 MeV, 1.1 MeV, 500 keV, and 100 keV. The doses at 100 keV were set to $4.0 \times 10^{12}$ atoms/cm$^2$, $6.0 \times 10^{12}$ atoms/cm$^2$, and $8.0 \times 10^{12}$ atoms/cm$^2$. The diffusion drive temperature and time were respectively set to 1000° C./1050° C./1100° C./1150° C. and 30 minutes.

(Manufacturing Method)

A method of manufacturing the semiconductor device of the embodiment includes: a step of preparing the substrate 10; a step of forming an epitaxial growth layer (n drift region 14) on the substrate 10; a step of forming an insulating film on the epitaxial growth layer (n drift region 14); a step of patterning the insulating film and performing multistage ion implantation to form the SJ structure of the SBD portion; a step of patterning the insulating film and performing ion implantation to form the FLRs in the FLR portion; a step of performing a drive process to diffuse the impurities implanted by multistage ion implantation to form the SJ structure in the SBD portion and ion implantation to form the FLRs of the FLR portion; a step of forming the insulating layer 36 (refer to FIGS. 35 to 38) over the entire device surface; a step of patterning the insulating layer 36 and forming a barrier metal to form a Schottky contact with the n drift region 14 of the SBD portion; a step of forming the anode electrode 20 on the barrier metal; a step of forming a protective film on the entire surface of the device; and a step of forming the cathode electrode 24 on the rear surface of the substrate 10.

In the steps above, the insulating layer 36 is a multilayer film including an $SiO_2$ film and a PSG film, with respective thicknesses of approximately 6,000 Å and 15,000 Å, for example.

Also, the etching process performed to form the Schottky contact with the n drift region 14 of the SBD portion is preferably wet etching.

The barrier metal to form the Schottky contact with the n drift region 14 of the SBD portion can be Ti/TiN, Mo, or the like, for example.

The anode electrode 20 formed on the barrier metal can be an AlCu alloy with a thickness of approximately 4.2 μm, for example.

An SiN film approximately 8,000 Å in thickness, for example, can be used as the protective film to cover the entire surface of the device.

The cathode electrode 24 can be made of a TiNiAuAg alloy, for example.

As described above, according to the present embodiment, it is possible to provide a Schottky barrier diode with improved withstand voltage, low leakage current, and low forward voltage drop.

<Other Embodiments>

An embodiment was disclosed above, but the description and drawings constituting a portion of the disclosure are merely examples, and do not limit the invention. Various substitute embodiments, examples, and applied techniques should be clear to a person skilled in the art based on this disclosure.

For example, in the semiconductor device of the embodiment, a silicon substrate was described as an example, but an SiC or GaN-type semiconductor material may be used as another type of semiconductor material, for example.

In this manner, the present invention includes various embodiments and the like not disclosed here.

INDUSTRIAL APPLICABILITY

The semiconductor device of the present invention can be widely used in power devices such as Si power semiconductor modules, SiC power semiconductor modules, and intelligent power modules, and in particular, can be used in inverters and converters for vehicles, solar cells, and industrial equipment where miniaturization, and low weight are desired.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a first conductive type semiconductor substrate;
   a first conductive type drift region formed by epitaxial growth over the semiconductor substrate;
   a first conductive type high resistance layer between the semiconductor substrate and the drift region, having a resistance higher than that of the drift region;

a plurality of second conductive type vertical implantation regions formed in the drift region by multistage ion implantation, the second conductive type vertical implantation regions having a prescribed width and being at a prescribed horizontal distance from each other in the drift region, each of the second conductive type vertical implantation regions is a plurality of vertically disposed discrete regions, at least some of which are discontinuous from each other;

an anode electrode disposed on a front surface of the drift region opposite to the semiconductor substrate, the anode electrode being in Schottky contact with the drift region and in ohmic contact with the second conductive type vertical implantation regions; and a cathode electrode disposed on a rear surface of the semiconductor substrate opposite to the drift region, the cathode electrode being in ohmic contact with the semiconductor substrate, wherein a depletion layer spreads from each of the second conductive type vertical implantation region, the depletion layer being continuous from the anode electrode to the first conductive type high resistance layer.

2. The semiconductor device according to claim 1, wherein a thickness of the drift region formed by the epitaxial growth is 7 μm to 9 μm.

3. The semiconductor device according to claim 1, wherein a resistivity of the drift region formed by the epitaxial growth is 0.7 Ωcm.

4. The semiconductor device according to claim 1, wherein said width of the vertical implantation regions is 0.8 μm to 1.0 μm.

5. The semiconductor device according to claim 1, wherein said distance between the vertical implantation regions is 3.0 μm to 3.2 μm.

6. The semiconductor device according to claim 1, wherein the drift region includes a prescribed number of field limiting rings formed around an area where the vertical implantation regions are formed, the field limiting rings being formed by multistage ion implantation, and having a prescribed width and being at a prescribed horizontal distance from each other, and each of the field limiting rings is a plurality of vertically disposed discrete regions, at least some of which are discontinuous from each other.

7. The semiconductor device according to claim 6, wherein the number of said field limiting rings is two or greater.

8. The semiconductor device according to claim 7, wherein a gap between the field limiting rings is 1.6 μm to 3.2 μm.

9. The semiconductor device according to claim 8, wherein the gap between the field limiting rings is 2.3 μm to 2.6 μm.

10. The semiconductor device according to claim 6, further comprising an insulating layer disposed on the field limiting rings,
wherein the anode electrode extends over the field limiting rings across the insulating layer.

11. The semiconductor device according to claim 1, wherein the vertical implantation regions are formed in the drift region so as to form a stripe pattern or dot pattern in a plan view.

12. The semiconductor device according to claim 1, further comprising:
an insulating layer sandwiched by the anode electrode and the first conductive type drift region;
a plurality of floating field limiting rings in the drift region under the insulating layer, the floating field limiting rings being formed by multistage ion implantation, having a prescribed width and being at a prescribed horizontal distance from each other, and each of the floating field limiting rings is formed by a plurality of vertically disposed discrete regions, at least some of which are discontinuous from each other.

* * * * *